US006674159B1

(12) United States Patent
Peterson et al.

(10) Patent No.: US 6,674,159 B1
(45) Date of Patent: Jan. 6, 2004

(54) BI-LEVEL MICROELECTRONIC DEVICE PACKAGE WITH AN INTEGRAL WINDOW

(75) Inventors: Kenneth A. Peterson, Albuquerque, NM (US); Robert D. Watson, Tijeras, NM (US)

(73) Assignee: Sandia National Laboratories, Albuquerque, NM (US)

( * ) Notice: Subject to any disclaimer, the term of this patent is extended or adjusted under 35 U.S.C. 154(b) by 45 days.

(21) Appl. No.: 10/082,961

(22) Filed: Feb. 25, 2002

Related U.S. Application Data

(63) Continuation-in-part of application No. 09/571,335, filed on May 16, 2000.

(51) Int. Cl.[7] .............................................. H01L 23/02
(52) U.S. Cl. .................... 257/680; 257/778; 257/779; 257/780; 257/737; 257/738; 257/693; 257/704; 257/431; 257/432; 257/433; 257/434
(58) Field of Search ......................... 257/680, 777–780, 257/737–738, 431–434, 693, 704, 682, 698

(56) References Cited

U.S. PATENT DOCUMENTS

| | | | |
|---|---|---|---|
| 4,742,182 A | 5/1988 | Fuchs ........................... 174/52 |
| 5,352,852 A | 10/1994 | Chun ........................... 174/52.4 |
| 5,357,056 A | 10/1994 | Nagano ......................... 174/524 |
| 5,493,391 A | 2/1996 | Neal et al. .................... 356/121 |
| 5,600,541 A | 2/1997 | Bone et al. ................... 361/707 |
| 5,729,038 A | 3/1998 | Young et al. ................. 257/460 |
| 5,864,381 A | 1/1999 | Neal et al. ................... 351/205 |
| 5,867,368 A | * | 2/1999 | Glenn ........................... 361/783 |
| 5,952,714 A | * | 9/1999 | Sano et al. .................... 257/680 |
| 6,117,193 A | * | 9/2000 | Glenn ........................... 29/25.01 |
| 6,335,224 B1 | 1/2002 | Peterson et al. .............. 438/114 |

OTHER PUBLICATIONS

Kenneth A. Peterson, et al; "Pre–Release Plastic Packaging of MEMS and IMEMS Devices" Patent Application 09/572,720 filed May 16, 2000.
Kenneth A. Peterson, et al, "Microelectronic Device Package with an Integral Window"; Ser. No. 09/571,335; filed May 16, 2000; Notice of Allowance Feb. 6, 2001.
M.L. Minges, et al., "Electronic Materials Handbook, vol. 1, Packaging", ASM International, Materials Park, OH, Jan., 1989, pp. 461–469.

* cited by examiner

Primary Examiner—David L. Talbott
Assistant Examiner—Luan Thai
(74) Attorney, Agent, or Firm—Robert D. Watson

(57) ABSTRACT

A package with an integral window for housing a microelectronic device. The integral window is bonded directly to the package without having a separate layer of adhesive material disposed in-between the window and the package. The device can be a semiconductor chip, CCD chip, CMOS chip, VCSEL chip, laser diode, MEMS device, or IMEMS device. The multilayered package can be formed of a LTCC or HTCC cofired ceramic material, with the integral window being simultaneously joined to the package during LTCC or HTCC processing. The microelectronic device can be flip-chip bonded so that the light-sensitive side is optically accessible through the window. The package has at least two levels of circuits for making electrical interconnections to a pair of microelectronic devices. The result is a compact, low-profile package having an integral window that is hermetically sealed to the package prior to mounting and interconnecting the microelectronic device(s).

41 Claims, 19 Drawing Sheets

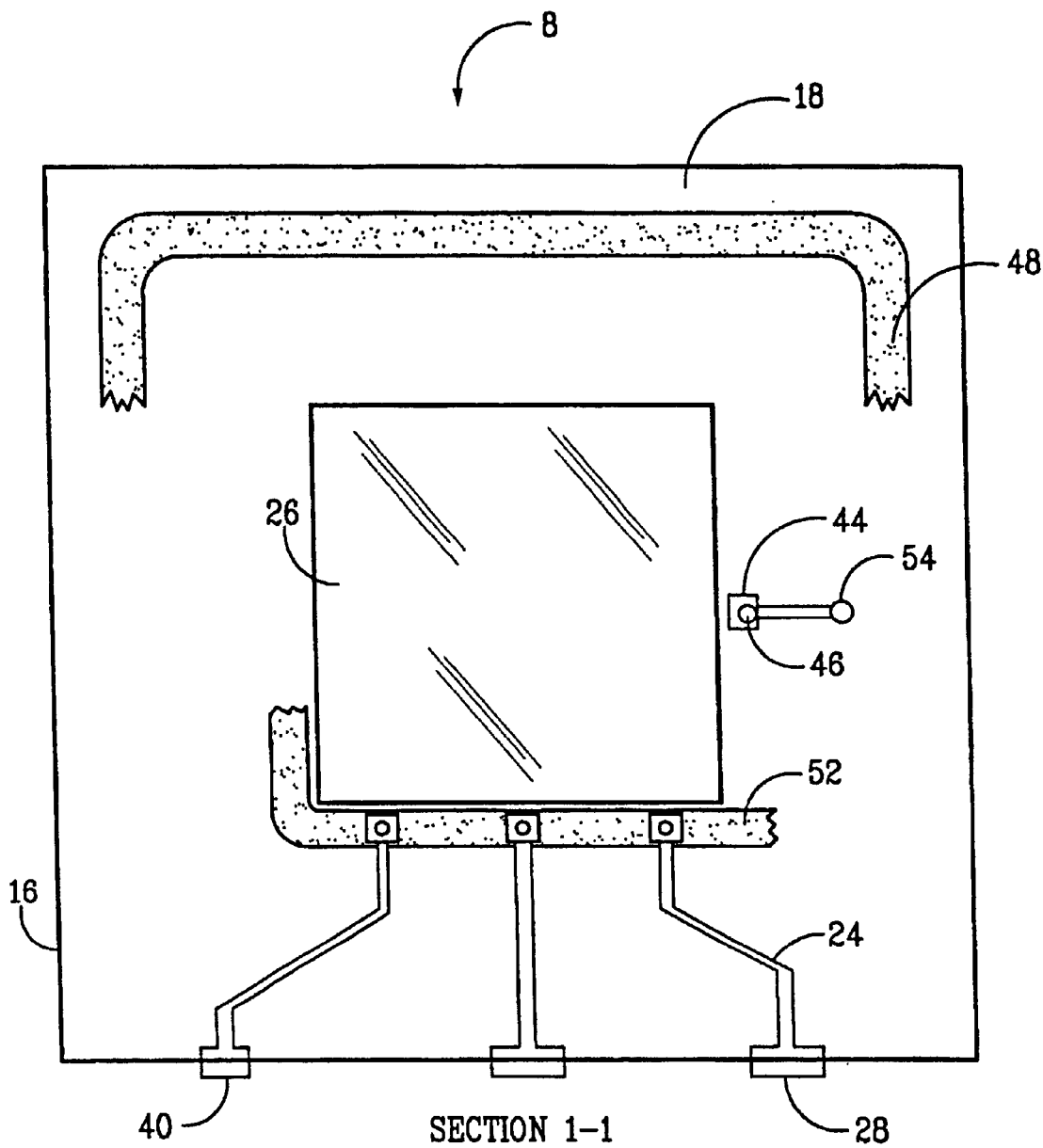

BI-LEVEL MICROELECTRONIC DEVICE PACKAGE WITH AN INTEGRAL WINDOW

CROSS-REFERENCE TO RELATED APPLICATIONS

This application is a Continuation-in-Part application of allowed U.S. patent application "Microelectronic Device Package with an Integral Window, Peterson and Watson, Ser. No. 09/571,335 filed May 16, 2000, which is incorporated herein by reference. This application is related to allowed U.S. patent application Ser. No 09/572,720 to Peterson and Conley, "Pre-Release Plastic Packaging of MEMS and IMEMS Devices", which is incorporated herein by reference. This application is also related to co-pending application, Ser. No. 10/093,454 "Single Level Microelectronic Device Package with an Integral Window", to Peterson and Watson, which is incorporated herein by reference.

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to the field of microelectronics, and more specifically to housing of microelectronic devices in a package having an integral window.

Many different types of microelectronic devices require a transparent window to provide optical, UV, and IR access; as well as protection from the environment. Examples of light-sensitive semiconductor devices include charge-coupled devices (CCD), photosensitive cells (photocells), solid-state imaging devices, and UV-light sensitive Erasable Programmable Read-Only Memory (EPROM) chips. All of these devices use microelectronic devices that are sensitive to light over a range of wavelengths, including ultraviolet, infrared, and visible light. Other types of semiconductor photonic devices emit photons, such as laser diodes, light emitting diodes (LED's), and Vertical Cavity Surface-Emitting Laser (VCSELS), which also need to pass light through a protective window.

Microelectromechanical systems (MEMS) and Integrated MEMS (IMEMS) devices (e.g. MEMS devices combined with Integrated Circuit (IC) devices) can also require a window for optical access. Examples of MEMS devices include airbag accelerometers, microengines, microlocks, optical switches, tiltable mirrors, adaptive mirror membranes, micro reflectors (retro-reflectors), micro reflectors with micro-shutters, miniature gyroscopes, sensors, and actuators. All of these MEMS devices use active mechanical and/or optical elements. Some examples of active MEMS structures include gears, hinges, levers, slides, tilting mirrors, optical sensors. These active structures must be free to move, rotate, or interact with light or other photonic radiation. Optical access through a window is required for MEMS devices that have mirrors and optical elements. Optical access to non-optically active MEMS devices can also be required for permitting visual inspection, observation, and/or performance characterization of the moving elements.

Additionally, radiation detectors that detect alpha, beta, and gamma radiation, use opaque "windows" of varying thickness and materials that transmit, block, or filter these energetic particles. These devices also have a need for windows that transmit or filter radiation to and from the active device, while at the same time providing physical.

There is a continuing need in the semiconductor fabrication industry to reduce costs and improve reliability by reducing the number of fabrication steps, while increasing the density of components. One approach is to shrink the size of packaging. Another is to combine as many steps into one by integrating operations. A good example is the use of cofired multilayer ceramic packages. Unfortunately, adding windows to these packages typically increases the complexity and costs.

Hermetically sealed packages are used to satisfy more demanding environmental requirements, such as for military and space applications. The schematic shown in FIG. 1 illustrates a conventional ceramic package for a MEMS device, a CCD chip, or other optically active microelectronic device. The device or chip is die-attached face-up to a ceramic package and then wirebonded to interconnect inside of the package. Metallized circuit traces carry the electrical signal through the ceramic package to electrical leads mounted outside. A glass window is attached as the last step with a frit glass or solder seal. Examples of conventional ceramic packages include Ceramic Dual In-Line Package (CERDIP), EPROM and Ceramic Flatpack designs.

Although stronger, ceramic packages are typically heavier, bulkier, and more expensive to fabricate than plastic molded packages. Problems with using wirebonding include the fragility of very thin wires; wire sweep detachment and breakage during transfer molding; additional space required to accommodate the arched wire shape and toolpath motion of the wirebond toolhead; and the constraint that the window (or cover lid) be attached after the wirebonding step. Also, attachment of the window as the last step can limit the temperature of bonding the window to the package. Finally, vapors emitted by polymer-based adhesives used to fasten the window can be deposited on released MEMS structures, causing problems with stiction.

FIG. 2 illustrates schematically a conventional molded plastic (e.g. encapsulated) microelectronic package. The chip is attached to a lead frame, and a polymer dam (e.g., epoxy) prevents the plastic encapsulant from flowing onto the light-sensitive active area of the chip during transfer molding. The window is attached with a polymer-based adhesive (e.g., an epoxy-based adhesive, a polyimide-based adhesive, a silicone-based adhesive, an acrylic-based adhesive, or a urethane-based adhesive). This type of package is not hermetic against moisture intrusion, cannot be used for high temperature operation, and the use of plastics and adhesives can interfere with the operation of MEMS structures.

Flip-chip mounting (i.e., interconnecting) of semiconductor chips is an attractive alternative to wirebonding. In flip-chip mounting,.the chip (i.e., device) is mounted face-down and then electrically interconnected to circuit traces on the substrate via "bumps" (e.g., balls, bumps, pads). The bumps can be made of gold, aluminum, copper, or solder, and can be joined using reflow soldering, plasma-assisted dry soldering, thermocompression bonding, ultrasonic bonding, or thermosonic bonding. All of the flip-chip interconnections are made simultaneously. Excess spreading of a molten solder ball/bump is prevented by the use of specially designed bonding pads. Flip-chip mounting has been successfully used in fabricating Multi-Chip Modules (MCM's), Chip-on-Board, Silicon-on-Silicon, and Ball Grid Array packaging designs.

Flip-chip mounting has many benefits over traditional wirebonding, including increased packaging density, lower lead inductance, shorter circuit traces, thinner package height, no thin wires to break, and simultaneous mechanical die-attach and electrical circuit interconnection. Another advantage is that the chips are naturally self-aligning due to favorable surface tension when using molten solder balls/bumps. It is also possible to replace the metallic solder bumps with bumps, or dollops, of an electrically-conductive polymer or epoxy (e.g. silver-filled epoxy). Flip-chip mounting avoids potential problems associated with ultrasonic bonding techniques that can impart stressful vibrations to a fragile (e.g. released) MEMS structure. A polymer underfll can be optionally applied to the rows of interconnected bumps to provide additional mechanical strength, and to improve reliability.

Despite the well-known advantages of flip-chip mounting, this technique has not been widely practiced for packaging of MEMS devices, Integrated MEMS (IMEMS), or CCD chips because attaching the chip facedown to a solid, opaque substrate prevents optical access to the optically active or photonically interactive surface.

The use of multilayered materials in electronic device packaging has a number of advantages. Each individual layer (i.e., ply or sheet) of dielectric material can be printed with electrically conducting metallic traces, and the traces on different levels can be interconnected by conductive paths (i.e., vias) that cut across the laminated layers. Each layer can be individually "personalized" by cutting unique patterns of cutouts in the layer, that, when stacked with other "personalized" layer, can create a complex internal three-dimensional structure of cavities, recesses, etc. Multilayered materials include laminated polymer-based printed circuit board, materials, and laminated ceramic-glass composite materials.

The cost of fabricating ceramic packages can be reduced by using cofired ceramic multilayered packages. Multilayered packages are presently used in many product categories, including leadless chip carriers, pin-grid arrays (PGA's), side-brazed dual-in-line packages (DIP's), flatpacks, and leaded chip carriers. Depending on the application, 5–40 layers of dielectric layers can be used, each having printed signal traces, ground planes, and power planes. Each signal layer can be connected to adjacent layers above and below by conductive vias passing through the dielectric layers at right angles to the plane of the layers.

Electrically conducting metallized traces, thick-film resistors, and conductive vias or Z-interconnects are conventionally made by thin-film or thick-film metallization techniques, including screen-printing, microjet printing, or etched foil methods. The multiple layers are printed, vias-created and filled, layers collated and registered. The layers are then joined together and permanently bonded at elevated temperature and pressure to form a rigid assembly.

For co-fired ceramic-based substrates, the process comprises lamination at a low temperature and high pressure; then burnout at an intermediate temperature, followed by firing at a high temperature. Burnout at 350–600 C. removes the organic binders and plasticizers from the substrate layers and conductor/resistor pastes. After burnout, these parts are fired at much higher temperatures, which sinters and devitrifies the glass-ceramic composite to form a dense, flawless, and rigid insulating structure. During firing, glass-forming constituents in the layers can flow and fill-in voids, corners, and join together adjacent or mating surfaces that are wetted by the molten glass-forming constituents.

Two different cofired ceramic systems are conventionally used, depending on the choice of materials: high-temperature cofired ceramic (HTCC), and low-temperature cofired ceramic (LTCC). HTCC systems typically use alumina substrates; are printed with molybdenum-manganese or tungsten conducting traces; and are fired at high temperatures, from 1300 C. to 1800 C. LTCC systems use a wide variety of glass-ceramic substrates; are printed with Au, Ag, or Cu metallizations; and are fired at lower temperatures, from 600 C. to 1300 C. After firing, the semiconductor die is attached to the fired HTCC (or LTCC) body; followed by wirebonding. Finally, the package is lidded and sealed by attaching a metallic, ceramic, or glass cover lid with a braze, a frit glass, or a solder seal, depending on the hierarchy of thermal processing and on performance specifications.

Use of cofired multilayer ceramic structures for semiconductor packages advantageously permits a wide choice of geometrical designs, cutout shapes, recessed cavities, and processing conditions, as compared to previous use of bulk ceramic pieces (which typically had to be cut and ground from solid blocks or bars, a tedious and expensive task). Ceramic packages with high-temperature seals are generally stronger and have improved hermeticity compared to plastic encapsulated packages. It is well known to those skilled in the art that damaging moisture can penetrate polymer-based seals and adhesive joints over time. Also, metallized conductive traces are more durable than freestanding wirebond segments, especially when the traces are embedded and protected within a layer of insulating material (e.g., in LTCC/HTCC packages).

The order in which the window is attached during the fabrication sequence is important. Conventional methods attach the window (or cover lid containing a window) to the package with an polymer-based adhesive after completing the steps of die attachment and wirebonding of the chip or MEMS device to the package. However, the fragile released MEMS structures are exposed to particulate contamination, mechanical stress, and electrical (static) damage during die attachment and wirebonding.

What is needed is a packaging process that minimizes the number of times that a MEMS device is handled and exposed to temperature cycles and different environments, which can possibly lead to contamination of the device. It is highly desirable, therefore, that as many of the package fabrication steps as possible are performed before mounting and releasing the MEMS device. What is needed, then, is a packaging process that attaches the window to the package before mounting the device to the package. It is also desired that the window be attached to the package body at a high temperature to provide a strong, hermetic bond between the window and the body, and to survive subsequent elevated temperature operations (e.g. lid sealing, soldering, etc.) in the hierarchy of temperature processing steps during fabrication. What also is needed is a method where the MEMS structures on the device face away from the cover lid, so that contamination is reduced when the cover lid is attached as the last step.

Electrical interconnections from the chip to the package are needed that are stronger and less fragile than conventional wirebonds. What also is needed is a package having a high degree of strength and hermeticity.

In some applications, it is also desired to stack back-to-back multiple chips, possibly of different types (e.g. CMOS, MEMS, etc.) inside of a single package containing one or more windows. This increases the packing density, which is highly desirable to reduce costs and size.

SUMMARY OF THE INVENTION

The present invention relates to a bi-level, monolithic multilayered package with an integral window for housing a microelectronic device. The integral window is bonded directly to the package without having a separate layer of adhesive material disposed in-between the window and the package. The device can be a semiconductor chip, CCD chip, CMOS chip, VCSEL chip, laser diode, MEMS device, or IMEMS device. The multilayered package can be formed of a LTCC or HTCC cofired ceramic material, with the integral window being simultaneously joined to the package during LTCC or HTCC processing. The microelectronic device can be flip-chip bonded so that the light-sensitive side is optically accessible through the window. The package has at least two levels of circuits for making electrical interconnections to a pair of microelectronic devices. The result is a compact, low-profile package having an integral window that is hermetically sealed to the package prior to mounting and interconnecting the microelectronic device(s).

BRIEF DESCRIPTION OF THE DRAWINGS

The accompanying drawings, which are incorporated in and form part of the specification, illustrate various examples of the present invention and, together with the description, serve to explain the principles of the invention.

FIG. 7 shows a schematic top view along line 1—1 of FIG. 3A of another example of a microelectronic package for housing at least one microelectronic device according to the present invention, illustrating examples of the electrically conducting metallized traces located on the upper surface of the first plate, including interconnect bumps, interior bond pads, exterior bond pads, and a conductive via.

FIG. 11 shows a schematic cross-section side view of another example of a package for housing a pair of back-to-back microelectronic devices, according to the present invention.

DETAILED DESCRIPTION OF THE INVENTION

Figure 1:
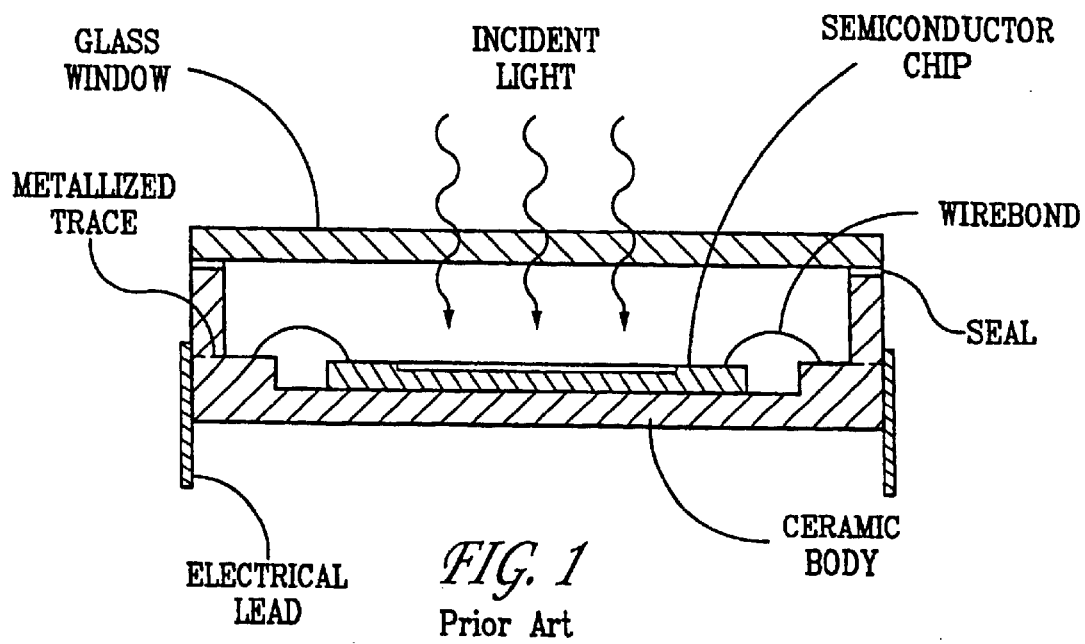
FIG. 1 shows a schematic cross-section view of a conventional ceramic microelectronic package, where the window or cover lid is attached last, after the microelectronic device has been joined (face-up) to the base and wirebonded.
Figure 2:
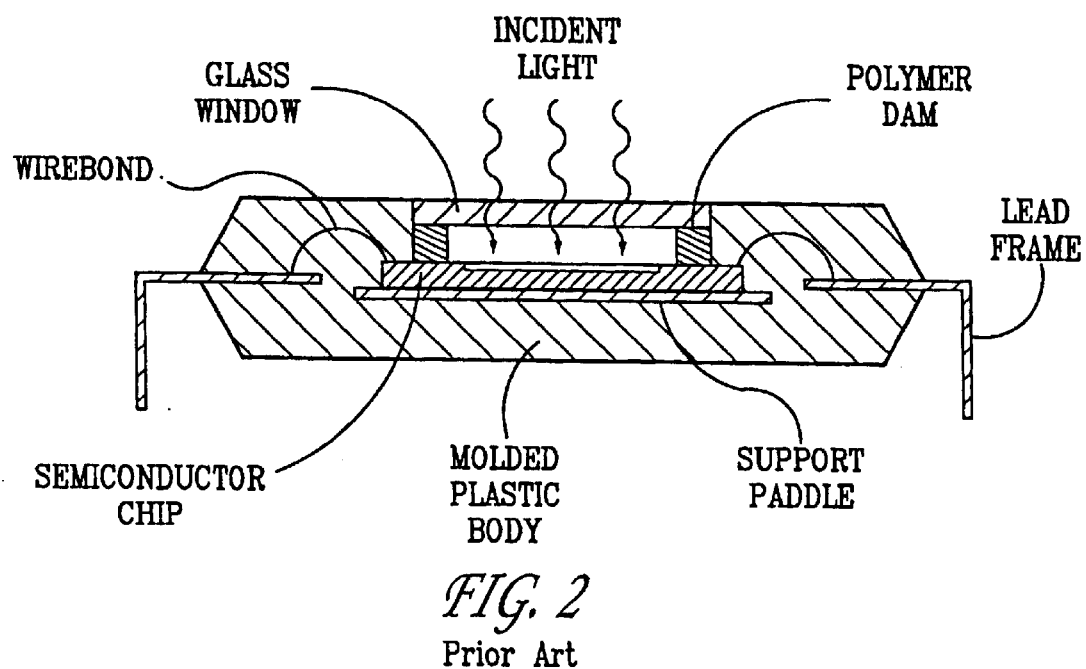
FIG. 2 shows a schematic cross-section view of a conventional plastic molded microelectronic package, where the microelectronic device, lead frame, and window are encapsulated in a plastic body by a transfer molding process.

The present invention relates to a package for housing at least one microelectronic device, comprising a hollow assembly of stacked, electrically insulating plates and an integral window.

It should be noted that the examples of the present invention shown in the figures are sometimes illustrated with the window facing down, which is the preferred orientation during flip-chip bonding. However, those skilled in the art will understand that the completed package can be oriented for use with the window facing upwards. It is intended that the method and apparatus of the present invention should be understood by those skilled in the art as applying to a plurality of chips or devices packaged in a one-dimensional or a two-dimensional planar array, as in a multi-chip module (MCM), including multiple windowed-compartments, and including having a window on either side of the package.

The word "transparent" (as it refers to "window") is broadly defined herein to include transmission of energetic particles and/or radiation (e.g., photons) covering the entire electromagnetic spectrum, including, but not limited to, IR, UV, and visible light (optical light). Likewise, the word "window" is broadly defined herein to include materials other than optically transparent glass, ceramic, or plastic; such as thin sheets of metal, which can transmit energetic particles (e.g. alpha, beta, gamma, and light or heavy ions). The phrase "light-sensitive" is broadly defined here to include all categories of examples listed above of devices that are observed by, interact with, or emit light, wherein "light" is defined herein to include photons of all frequencies and wavelengths of the electromagnetic spectrum, and energetic particles (i.e., radiation).

The phrase "MEMS devices" is broadly defined herein to include "IMEMS" devices, unless specifically stated otherwise. The word "plastic" is broadly defined herein to include any type of polymer-based dielectric composition, including, for example, polymer compounds, thermoplastic materials, thermoforming materials, and spin-on glass-polymer compositions. The phrases "released MEMS structures", "released MEMS elements", and "active MEMS elements" and "active MEMS structures" are used interchangeably to refer to a device having freely-movable structural" elements, such as gears, pivots, hinges, sliders, tilting mirrors, adaptive flexible mirrored membranes; and also to exposed active elements such as chemical sensors, flexible membranes, and beams with thin-film strain gauges, which are used in accelerometers and pressure sensors.

The word "integral" is defined herein to mean geometrically integrated into the insulating body or plate. The word "integral" can also mean that the window is attached, encased, encapsulated, or otherwise joined to the body or plate before mounting the microelectronic device(s) to the body or plate. The word "integral" can also mean that the window is bonded directly to the plate (or body) during the manufacturing process of fabricating the plate (or body).

The word "plate" is defined herein to also mean any three-dimensional body of any shape, including a non-flat plate. The word "plate" is defined herein to also mean a frame, as in a picture or window frame.

The words "adhesive" or "adhesive material", in addition to meaning a polymer-based adhesive (e.g., an epoxy-based adhesive, a polyimide-based adhesive, a silicone-based adhesive, an acrylic-based adhesive, or a urethane-based adhesive), is also defined herein to mean the following materials that can be used to join two surfaces together: a braze alloy, a frit glass compound, a glass-ceramic composite, a glass-polymer compound, a ceramic-polymer compound, a solder alloy, a solder glass compound, a stable solder glass compound, and a ceramizing solder glass compound.

Figure 3A:
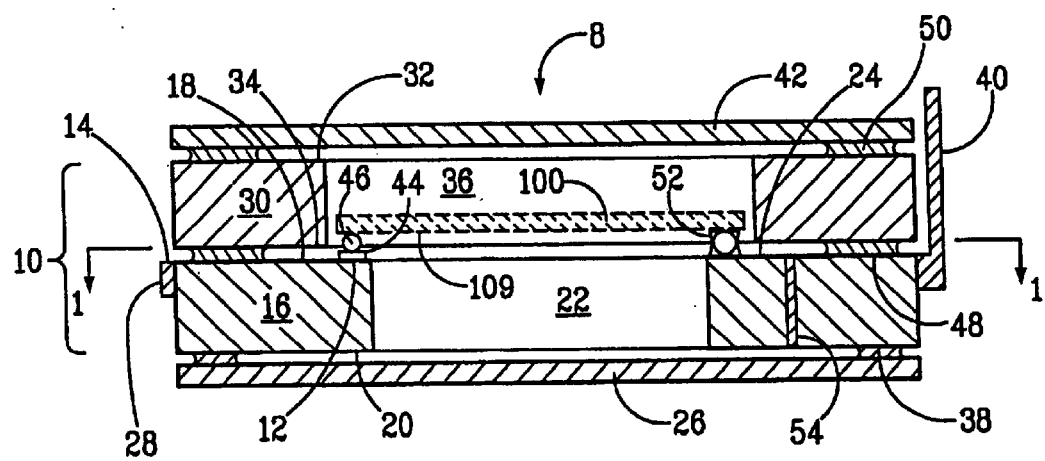
FIG. 3A shows a schematic cross-section view of an example of a microelectronic package according to the present invention, with the package having an integral window attached to a ceramic body including an first (lower) plate, a second (upper) plate, and an attached cover lid.

FIG. 3A shows a schematic cross-section view of an example of a microelectronic package for housing at least one microelectronic device according to the present invention, comprising a hollow assembly 10 of stacked, electrically insulating plates. The assembly 10 of FIG. 3A has an interior interconnect location 12 disposed on an interior surface of hollow assembly 10, and an exterior interconnect location 14 disposed on an exterior surface of assembly 10. Assembly 10 further comprises a first plate 16. Plate 16 has a first surface 20, an opposing second surface 18, and a first aperture 22 through plate 16. Plate 16 also has an electrical conductive metallized trace 24 (i.e., electrical conductor) disposed on surface 18, for conducting an electrical signal between interior interconnect location 12 and exterior interconnect location 14. Plate 16 further comprises a first window 26 bonded directly to plate 16, for providing optical access to a microelectronic device 100 that could be disposed within assembly 10.

In FIG. 3A, assembly 10 further comprises a second plate 30, which has a third surface 34, an opposing fourth surface 32, and a second aperture 36 through plate 30 for providing physical access to insert device 100 into package 8. Surface 18 of plate 16 is bonded directly to the surface 34 of plate 30 to form assembly 10. At least one lateral dimension of aperture 36 is slightly larger than the corresponding lateral dimension of aperture 22. Aperture 22 is substantially aligned with aperture 36. The lateral dimensions of aperture 36 are slightly larger than the lateral dimensions of device 100, so that device 100 can fit inside of aperture 36.

In FIG. 3A, window 26 is attached flush to plate 16. The attachment can comprise a first seal 38. Other mounting arrangements will be disclosed later. The shape of aperture 22 and aperture 36 can be polygonal (e.g. square or rectangular) or circular. Aperture 22 can have a different shape than aperture 36. The horizontal surfaces of device 100, plate 16, plate 18, and window 26 all can be substantially coplaner. Microelectronic device 100 can comprise a microelectronic device 100.

In FIG. 3A, microelectronic device 100 can be flip-chip interconnected (e.g. flipped facedown, with light-sensitive area 109 of device 100 facing towards window 26) to surface 18 of plate 16. The method of flip-chip mounting is well-known to those skilled in the art. Surface 18 can comprise a bond pad 44 electrically connected to metallized trace 24 at interior interconnect location 12. Microelectronic device 100 can include interconnect bump pre-attached to device 100. The word "bump" is defined herein to include balls and pads. Alternatively, surface 18 can comprise an interconnect bump 46, connected either to metallized trace 24 or to bond pad 44 at interior interconnect location 12. Interconnect bump 46 can comprise an electrically conductive material (e.g. gold, gold alloy, aluminum, copper, solder, and silver-filled or gold-filled polymer) for electrically connecting device 100 to metallized trace 24 or bond pad 44. Alternatively, bump 46 can comprise a non-conducting, adhesive material (e.g. epoxy resin, polyimide, silicone, or urethane) for providing mechanical attachment of device 100 to surface 18. The phrase "flip-chip bonding" is defined herein to include not only reflow soldering, but also Tape Automated Bonding (TAB bonding), to thermocompression bonding, ultrasonic bonding, and thermosonic bonding.

In FIG. 3A, package 8 can include a bond pad 28 attached to assembly 10 at exterior interconnect location 14. Bond pad 28 can be electrically connected to metallized trace 24. Package 8 can also include an electrical lead 40 attached to assembly 10 at exterior interconnect location 14. Lead 40 can be electrically connected to metallized trace 24. Optionally, lead 40 can be attached to bond pad 28. Assembly 10 can also comprise an electrically conductive via 54, which can be in electrical communication with metallized trace 24. Via 54 can be oriented perpendicular to surface 18, and can be disposed from surface 18 to surface 16. Via 54 can be made electrically conducting by filling hole 54 with solder or other flowable, electrically conducting material.

In FIG. 3A, assembly 10 can include a cover lid 42 attached to surface 32 of plate 30. Attachment of cover lid 42 can complete the packaging of semiconductor device 100 inside of a sealed package 8. Cover lid 42 can include a second window (not shown in FIG. 3A), for providing optical access through aperture 36. Optionally, the ambient air inside of sealed package 8 can be substantially removed before attaching cover lid 42, and replaced with at least one gas other than air. This other gas can include an inert gas (e.g. argon, nitrogen, or helium). Helium can be easily detected by a conventional helium leak detector, thereby providing information on the hermetic quality of the joints and seals in package 8. The level of humidity can also be adjusted prior to sealing package 8 with cover lid 42.

In FIG. 3A, plate 16 is attached to plate 18. This attachment can comprise a second seal 48 disposed in-between surface 18 and surface 34. Seal 48 can have an annular shape. Likewise, the attachment between cover lid 42 and plate 30 can comprise a third seal 50. Seal 50 can also have an annular shape. The bonding material used for either seals 38, 48 or 50 can comprise a hermetic sealant (e.g. a braze alloy, a frit glass compound, a glass-ceramic composite, a glass-polymer compound, a ceramic-polymer compound, or a solder alloy) or a polymer-based adhesive material (e.g., an epoxy-based adhesive, a polyimide-based adhesive, a silicone-based adhesive, an acrylic-based adhesive, or a urethane-based adhesive). Selection of a particular material for seal 38, 48 or 50 should take into consideration the hierarchy of thermal processing for the entire packaging process. Here, "thermal hierarchy" means that the highest temperature processes (e.g. sintering, joining, etc.) are performed first, followed by progressively lower temperature processes, with the lowest temperature process being performed last in the sequence of fabrication steps.

Window 26 can comprise an optically transparent material (e.g., a borosilicate glass, a quartz glass (i.e. fused silica), a low-iron glass, a leaded glass, a tempered glass, a low thermal-expansion glass, or a transparent ceramic, such as sapphire). Sapphire (single crystal $Al_2O_3$) is an attractive choice for an optically transparent window because of its high strength, high hardness, high reliability, and high melting point (2030 C.), which allows it to be used at the upper end of HTCC processing (about 1300 C.) without softening or melting. Alternatively, a transparent plastic or polymer-based material can be used (e.g. PMMA). Some plastics are transparent in the UV spectrum. Silicon and germanium can be used for windows that need to be transparent in the IR spectrum. Other window materials can be used that are transparent in the IR and/or UV wavelengths, including barium fluoride, calcium fluoride, lithium fluoride, magnesium fluoride, potassium fluoride, sodium chloride, zinc oxide, and zinc selenide. Preferably, the window's coefficient of thermal expansion (CTE) is about equal to the CTE of plate 16. Alternatively, the mismatch in CTE between window 26 and plate 16 can be chosen avantageously so that window 26 is placed in compression. Window 26 can optionally comprise optical quality properties (e.g. purity, flatness, and smoothness).

Window 26 can comprise means for filtering selected wavelengths of light. Coloring dyes, or other elements, can be added to the glass or plastic formulations to form windows that can filter light, as is well-known to the art. Anti-reflection coatings can be applied to the surface or surfaces of window 26 to reduce reflection and/or increase transmission. Also, surface treatments (e.g. thin-film or thick-film coatings or controlled surface roughness) can be applied to the periphery of window 26 in order to improve the wettability of molten solders and brazes, or to improve the bond strength of window 26 to plate 16 during co-firing or co-bonding operations by promoting wetting to flowable glassy materials or flowable semi-solid polymers. For example, a thick-film conductor paste containing gold or silver metallizations can be applied to the outer rim of a sapphire window and pre-fired in air to burnout organics and to sinter other materials. The metal-edged sapphire window can subsequently be bonded to LTCC in a cofiring step, or brazed to a bulk ceramic plate. The same surface treatments can also be applied to the mating surfaces of other pairs of surfaces to be joined, including plates 16 and 30, and cover lid 42. Window 26 can also be made of a metal or metal alloy, for use in packaging of a microelectronic device used for detecting energetic particles. Window 26 can also comprise a glass or sapphire member pre-mounted in a thin-profile metallic frame using a high-temperature braze, and the metallic frame is integrally bonded to the insulating substrate 16. Window 26 is attached to plate 16 prior to attaching microelectronic device 100 to package 8.

In FIG. 3A, assembly 10 includes plates comprising an electrically insulating material (e.g. a ceramic, a polymer, a plastic, a glass, a glass-ceramic composite, a glass-polymer composite, a resin material, a fiber-reinforced composite, a glass-coated metal, or a printed wiring board composition) well-known to the art. The ceramic material can comprise alumina, beryllium oxide, silicon nitride, aluminum nitride, titanium nitride, titanium carbide, or silicon carbide. Fabrication of ceramic parts can be performed by processes well-known to the art (e.g. slip casting, machining in the green state, cold-isostatic pressing (CIP) followed by hot-isostatic pressing (HIP) or sintering, and uniaxially hot/cold pressing, or rapid forging). Fabrication of plastic and polymer parts can be performed by processes well-known to the art (e.g. transfer molding, injection molding, and machining of printed wiring board (PWB) sheets). Bulk ceramic parts can be metallized prior to brazing or soldering to promote wetting.

Ceramic packages are generally stronger and more hermetic than plastic encapsulated packages. Instead of using bulk pieces of ceramic, ceramic packages can be made of cofired ceramic multilayers. This fabrication process begins by making a "green" unfired material by casting a blend of ceramic and glass powders, organic binders, plasticizers, and solvents; and doctor-blading the blend on a long continuous belt to form thin and pliable sheets or tapes. The organic components provide strength and flexibility to the green tape during handling. Next, via holes are punched out of the tape (or laser drilled) and shapes (i.e., square or rectangular shapes) are cutout of the tape to "personalize" each layer. Then, the vias are filled with a conductive ink or paste. Next, surface conductive traces (lines) are applied by depositing a thick-film conductive ink or paste on one or more layers (i.e., by screen printing or microjet printing). After drying, the personalized layers are then stacked (e.g., collated) and registered, and then placed in a uniaxial press or placed on a rigid plate inside of a vacuum bag. A RTV mold insert (or other elastomeric material) can be inserted into any cavity (i.e., aperture) inside of the stack, to prevent collapse of the cavity during the laminating step (especially when using isostatic pressure). Use of a flexible insert, rather than a rigid one, allows some accommodation of the shape changes during lamination. The stack of registered layers is then laminated together at high pressure (e.g., 3000 psi) and low temperatures (e.g., 68 C.) in the uniaxial press, or in an isostatic pressure vessel/autoclave (e.g., with the vacuum bag submerged in water), to form a semi-rigid "laminated" block that is still in the green state.

Next, the laminated block (i.e., sandwich) is removed from the fixture or bag and then is subjected to a cofire heating cycle. During the ramp-up stage, the temperature is held at an intermediate temperature (e.g., about 350–600 C., and more particularly, about 400–450 C.) to remove (i.e., "burnout" and pyrolize) the organic binders and plasticizers from the substrate layers and conductor/resistor pastes. Sufficient burnout time is required to prevent any blistering due to residual organics that volatize during the subsequent firing period. After burnout has been completed, the temperature is increased to the "firing" temperature (e.g., 600–1800 C.), which sinters and devitrifies the glass-ceramic composite to form a consolidated and rigid monolithic structure. During firing, glass-forming constituents in the layers can flow and avantageously fill-in any voids, corners, etc. The word "cofiring" refers to the simultaneous firing of the conductive ink/pastes along with the firing of the dielectric green tape layers and embedded resistors or other discrete components, and includes both the burnout and firing stages of the cofire heating cycle.

Two different cofired ceramic systems can be used, depending on the choice of materials: High-Temperature Cofired Ceramic (HTCC), and Low-Temperature Cofired Ceramic (LTCC). In the HTCC system, the ratio of ceramic to glass is high (9/1, or greater) and the dielectric comprises glass fillers in a ceramic matrix (e.g., 96 wt % alumina and 4 wt % glass). Hence, the green material can only be sintered at high firing temperatures (e.g., 1300 to 1800 C.). In this case, the thick-film conductive pastes contain high melting point metals (e.g., tungsten, or alloys of molybdenum and manganese). HTCC parts can be fired in a wet hydrogen furnace.

Alternatively, in the LTCC system, the ratio of ceramic to glass is low and the dielectric comprises a ceramic-filled glass matrix (e.g., 50–70 wt % glass and 30–50 wt % ceramic (e.g., alumina, silica)), which can be sintered at much lower firing temperatures (e.g. 600 C. to 1300 C.). At these firing temperatures, thick-film metallization can comprise high-conductivity metals, such as gold, silver, copper, silver-palladium, and platinum-gold. Examples of commercially available LTCC systems that can be used in the present invention are listed in Table 1.

TABLE 1

LTCC Systems

| System | Matrix | Filler | Metallization |
| --- | --- | --- | --- |
| Asahi Glass | Ba—Al$_2$O$_3$SiO$_2$—B$_2$O$_3$ | Al$_2$O$_3$, Fosterite | N.A. |
| DuPont | Alumino Silicate | Al$_2$O$_3$ | Silver, Gold |
| Fujitsu | Borate glass | Al$_2$O$_3$ | Copper |
| Matsushita | 0.35NaAlSi$_3$O$_8$ + 0.65CaAl$_2$Si$_2$O$_8$ | N.A. | Copper |
| Murata | BaO—B$_2$O$_3$—Al$_2$O$_3$—CaO—SiO$_2$ | N.A. | Copper |
| Narumi | CaO—Al$_2$O$_3$—B$_2$O$_3$—SiO$_2$ | Al$_2$O$_3$ | Silver, gold(top) |
| NEC | Lead Borosilicate | Al$_2$O$_3$ | Silver, Palladium |
| Shoei | BaZr(BO$_3$)$_2$ | SiO$_2$ | Copper |
| Taiyo Yuden | CaO—MgO—Al$_2$O$_3$—SiO$_2$—B$_2$O$_3$ | N.A. | Copper |

In both systems (LTCC and HTCC) a net shrinkage occurs after burnout and firing, which can be as much as 12% shrinkage. Such a large shrinkage can place a cofired window in compression during fabrication (which also places the plate/window joint in compression). However, rigid clamping or fixturing during firing can restrain this shrinkage, if needed.

If hermetic-quality packaging is not required, then polymer-based materials can be used. Single layer or multilayer printed wiring board (PWB) materials can be used for constructing assembly 10, such as a glass-reinforced epoxy (e.g., FR4) or a glass-reinforced polyimide or polyimide epoxy. Multilayer PWB's have more than two layers of circuitry (i.e., metallized traces). The multiple layers of PWB composition with copper cladding are personalized, collated, registered, and laminated under high pressure (up to about 1500 psi) and low temperature (up to about 175 C. for epoxy resin systems, and up to 260 C for polyimide systems) in a single bonding step (e.g. co-bonded) to form a multilayered assembly 10. During lamination, the B-stage Prepreg (partially cured resin) melts under pressure, and then flows, dissolving air and volatiles. When it cures, it in glues the entire stack into a rigid assembly. Metallized trace 24 can be fabricated by using an etched-foil process, well-known to those skilled in the art.

Figure 3B:
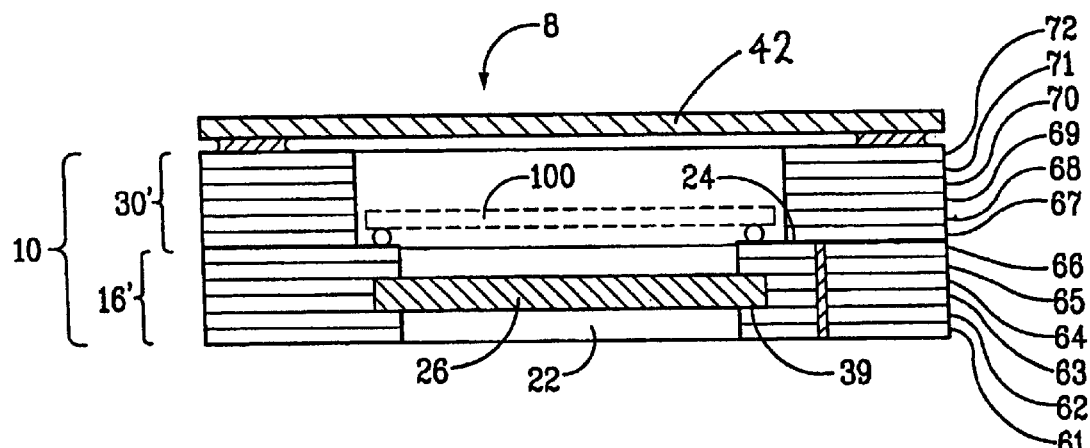
FIG. 3B shows a schematic cross-section view of another example of a microelectronic package according to the present invention, with the package having an integral window cofired with a cofired multilayered assembly of twelve individual layers, and an attached cover lid.

FIG. 3B shows a schematic cross-section view of a second example of a microelectronic package 8 for housing at least one microelectronic device according to the present invention, comprising a hollow assembly 10 of stacked, electrically insulating plates comprising multiple layers of ceramic tape with conductive traces that have been collated, laminated, baked, and fired under simultaneous pressure and temperature (e.g. cofiring) to form a multi-layered cofired ceramic assembly 10. Such a construction technique readily accommodates the stepped interior-surface profile used hold window 26 and for mounting device 100, since the individual layers are easily punched-out or cut (e.g., via a laser, water-jet, or mechanical press) into a variety off configurations with holes for vias and cutouts for apertures of varying sizes that can be stacked and cofired to form multi-layered cofired ceramic assembly 10. For example, FIG. 3B shows an arrangement for integrating window 26 into sub-stack 16' comprising an encased joint geometry 39 (where the edges of window 26 are completely embedded or encapsulated inside sub-stack 16'). If a bulk ceramic plate were used, it would be very difficult to manufacture such a reentrant feature for housing encased window 26 therein. However, by using a multilayered construction, this is relatively easy to do. Also, encased joint geometry 39 locks the window into place and prevents it from falling out if the window 26 somehow becomes detached from sub-stack 16 (i.e., it's a self-locking joint geometry).

In FIG. 3B, assembly 10 comprises twelve individual layers of ceramic tape stacked, laminated, and cofired to form a monolithic (i.e., unitized) body having an integral window 26. The part of assembly 10 grouped as sub-stack 16' comprises six individual layers (e.g. sheets) of glass-ceramic tape (e.g. layers 61, 62, 63, 64, 65, and 66). Likewise, the part of assembly 10 grouped as sub-stack 30' comprises six additional individual layers (e.g. layers 67, 68, 69, 70, 71, and 72). Each layer can be individually personalized with the appropriate inside and outside dimensions. Metallized trace 24 can be deposited on the upper surface of layer 66 (corresponding to surface 18 of FIG. 3A) prior to stacking of the individual layers. Window 26 can be placed into the stack of layers after layers 61, 62, 63, and 64 have been stacked and registered. The remaining eight layers (e.g. 65–72) can be stacked and registered after go window 26 has been inserted. Then, the entire stack of twelve layers (e.g. 61–72) is laminated; and then baked and fired (i.e., cofired) at the appropriate temperatures and pressures for the required time to form a unitized, monolithic body including an integral window 26.

Because window 26 is co-fired simultaneously along with the stacked layers of ceramic tape, the window is bonded directly to the fired ceramic sub-stack 16' without having a separate layer of adhesive material disposed in-between window 26 and sub-stack 16'. Likewise, it is not necessary to join sub-stack 16' to sub-stack 30' with a separate seal 48 (as shown in FIG. 3A), because this joint is made simultaneously with all of the other layers during the cofiring or co-bonding process.

The words "cofire", "cofired", and "cofiring" are broadly defined herein to include "co-bonding" of plys made of polymer-based materials that are commonly used to fabricate a printed wiring board (printed circuit board) multilayered substrate. For example, if printed wiring board material (i.e., polymer-based plys) are used to make the embodiment in FIG. 3B, then the integral window 26 would be co-bonded directly to the polymer-based layers during lamination of the stacked polymer-based plys 61–72, without having a separate layer of adhesive material disposed in-between window 26 and sub-stack 16'.

Those skilled in the art will understand that other thicknesses for sub-stacks 16'and 30' can be formed by laminating a different number of layers of the cofired ceramic multi-layered material (or co-bonded PWB material).

Figure 4A:
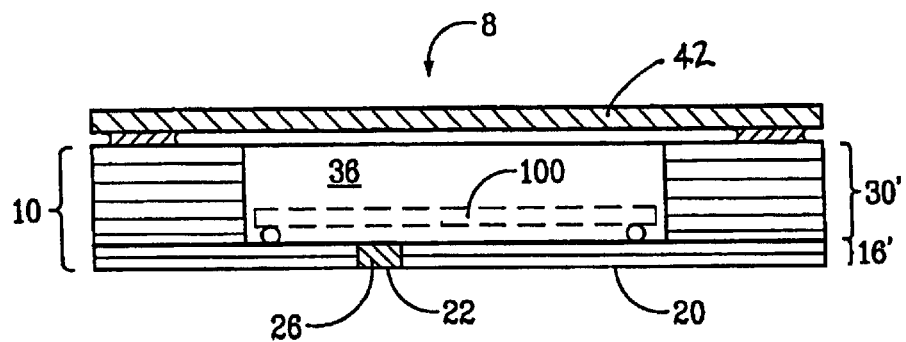
FIG. 4A shows a schematic cross-section view of another example of a microelectronic package according to the present invention that is similar to the second example of FIG. 3B, but with a cofired window substantially filling up the aperture through the first plate.

FIG. 4A of the present invention illustrates an example where sub-stack 16' comprises a fewer number of layers (e.g. two layers: 63 and 64). In this case, aperture 22 is substantially filled up by window 26. In this case, window 26 can be fabricated integrally with sub-stack 16' by casting (i.e., molding) a molten glass or a transparent liquid polymer directly into aperture 22, whereupon the molten glass or transparent liquid polymer solidifies or hardens upon cooling/curing. Cast/molded window 26 can have a convex (or concave) outer surface to concentrate (or spread) light (i.e., as a lens) passing through window 26.

In the example shown in FIG. 4A, the size of aperture 22 (and, hence, window 26) is much smaller than the size of device 100. It is not required that the size of window 26 be similar to the size of aperture 22. Also, the example of FIG. 4A shows that the centerline of aperture 22 does not align with the centerline of aperture 36, e.g. aperture 22 is offset laterally from aperture 36. It is not required that aperture 22 be aligned with aperture 36. However, aperture 22 can be substantially aligned with aperture 36. Those skilled in the art will understand that more than one small aperture 22 can be included in sub-stack 16', for providing multiple locations for providing optical access to device 100.

Alternatively, with respect to FIG. 4A, aperture 22 can be created by drilling, milling, or ablating (e.g., laser drilling) a hole or opening into surface 20 of cofired assembly 10 (i.e., after cofiring without a window), and then substantially filling the newly created aperture 22 by casting (i.e., molding) a molten glass or a transparent liquid polymer directly into aperture 22, whereupon the molten glass or transparent liquid polymer solidifies or hardens upon cooling/curing. The step of casting/molding window 26 into newly created aperture 22 can be performed at various stages in the fabrication and packaging sequence, including: (1) casting/molding window 26 before microelectronic device 100 has been flip-chip interconnected to assembly 10 and cover lid 42 attached; (2) casting/molding window 26 after microelectronic device 100 has been flip-chip interconnected to assembly 10, but before attaching cover lid 42; or (3) casting/molding window 26 after microelectronic device 100 has been flip-chip interconnected to assembly 10 and after cover lid 42 has been attached.

Figure 4B:
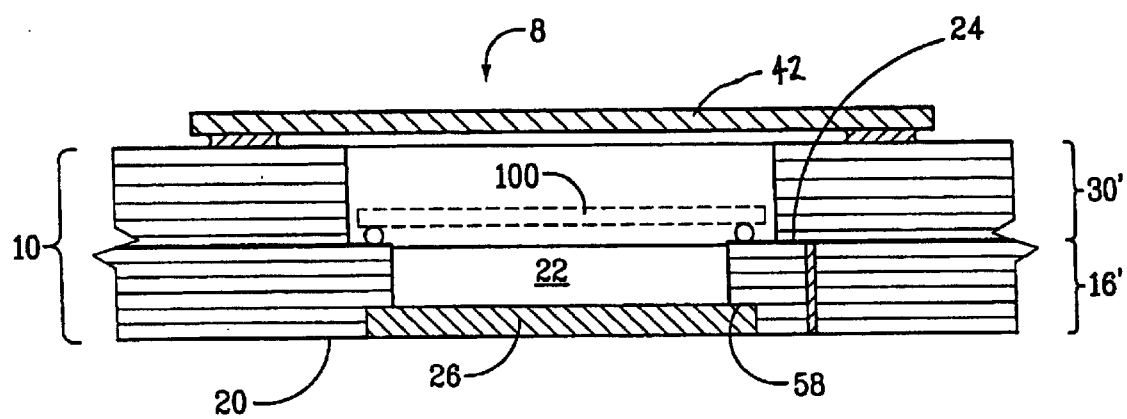
FIG. 4B shows a schematic cross-section view of another example of a microelectronic package according to the present invention that is similar to the second example of FIG. 3B, but with a cofired window mounted to a recessed lip located inside of the first plate, recessed from the second surface of the first plate.

FIG. 4B shows a schematic cross-section view of another example of a microelectronic package 8 for housing at least one microelectronic device according to the present invention, wherein window 26 is attached to recessed lip 58 formed inside of sub-stack 16', wherein the lip can be recessed away from second surface 20 of first sub-stack 16'. Recessed lip 58 can be easily defined by using a cofired or co-bonded multilayered construction technique, as described previously. Window 26 becomes an integral part of sub-stack 16' during co-firing or co-bonding of the multiple layers, and, therefore, a separate layer of adhesive material disposed in-between window 26 and sub-stack 16' is not required. The broken lines on the edges of sub-stacks 16' and 30' in FIG. 4B indicates that sub-stacks 16' and 30' can extend laterally an unlimited distance beyond the immediate material surrounding apertures 22 and 36.

Alternatively, the width of sub-stacks 16' and 30' can be limited to extending only a short distance beyond the apertures 22 and 36, as illustrated in FIG. 4A. In this example, sub-stacks 16' and 30' can be considered to be a frame for a package that might be housing a single device or chip.

Figure 4C:
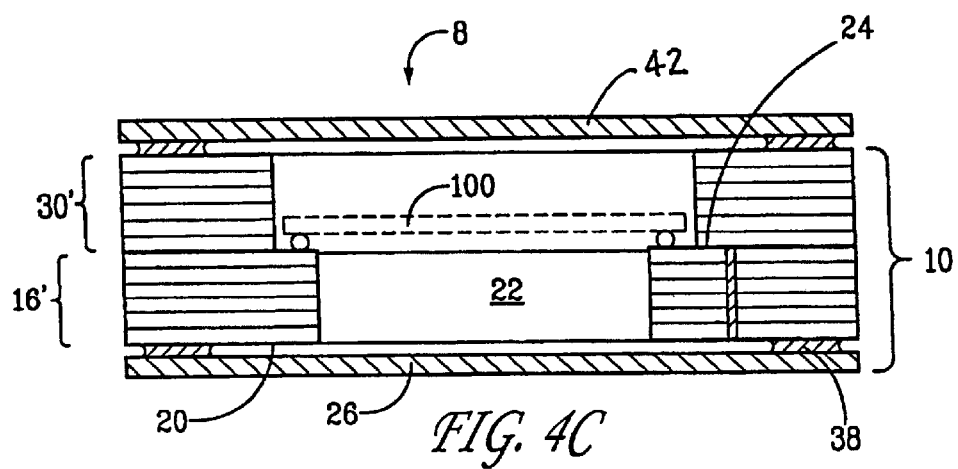
FIG. 4C shows a schematic cross-section view of another example of a microelectronic package according to the present invention that is similar to FIG. 3B, but with a window mounted flush to the bottom surface of the first plate.

FIG. 4C shows a schematic cross-section view of another example of a microelectronic package 8 for housing at least one microelectronic device according to the present invention that is similar to the example of FIG. 3B, but with window 26 attached flush to second surface 20 of sub-stack 16'. Window 26 can be attached to sub-stack 16' with seal 38. Seal 38 can comprise a hermetic sealant material or an adhesive material, as described previously. Alternatively, window 26 can be cofired integrally with substacks 16' and 30'.

Figure 5:
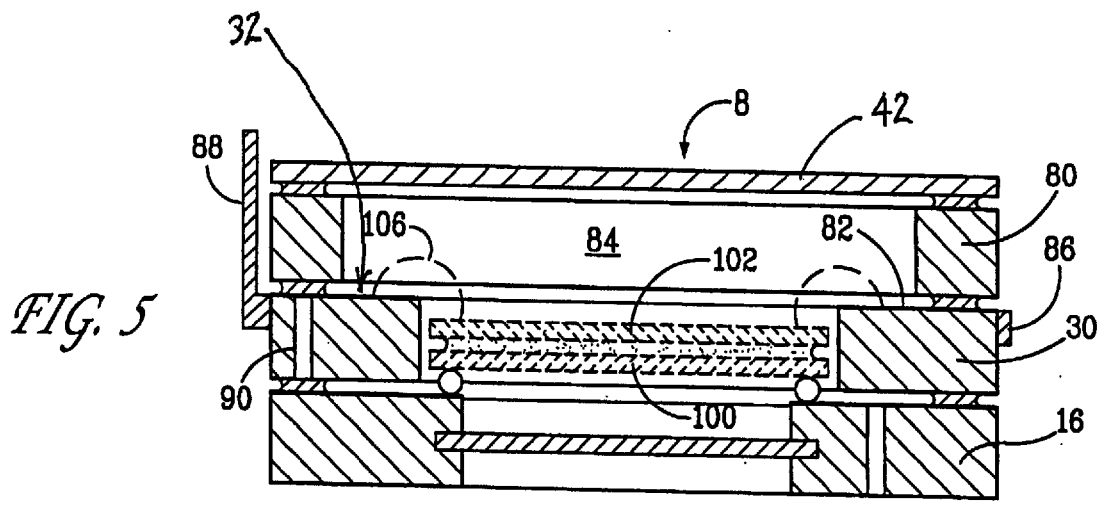
FIG. 5 shows a schematic cross-section view of another example of a microelectronic package according to the present invention, with the package having an integral window cofired to a cofired multilayered assembly including an first (bottom) plate, a second (middle) plate, a third (top) plate, and an attached cover lid, for packaging a pair of stacked chips, including a MEMS chip flip-chip interconnected to the first plate, and a second chip attached to the backside of the MEMS chip, wirebonded to the second plate.

FIG. 5 shows a schematic cross-section view of another example of a microelectronic package 8 for housing at least one microelectronic device according to the present invention, that is similar to the first example of FIG. 3A; wherein assembly 10 further comprises a second electrically conductive metallized trace 82 disposed on third surface 34 of plate 30; and a third plate 80 bonded to third surface 34, wherein plate 80 includes a third aperture 84 through plate 80; and further wherein at least one lateral dimension of aperture 84 is slightly larger than the corresponding lateral dimension of aperture 36; and wherein aperture 84 is substantially aligned with aperture 36. Assembly 10 can further comprise a second bond pad 86 or second electrical lead 88 attached to metallized trace 82. Assembly 10 can further comprise a second solder-filled via 90, vertically disposed inside plate 30. Those skilled in the art will understand that additional plates having apertures and metallized traces can be stacked on top of previous plates, to construct as many levels as is needed.

Figure 6A:
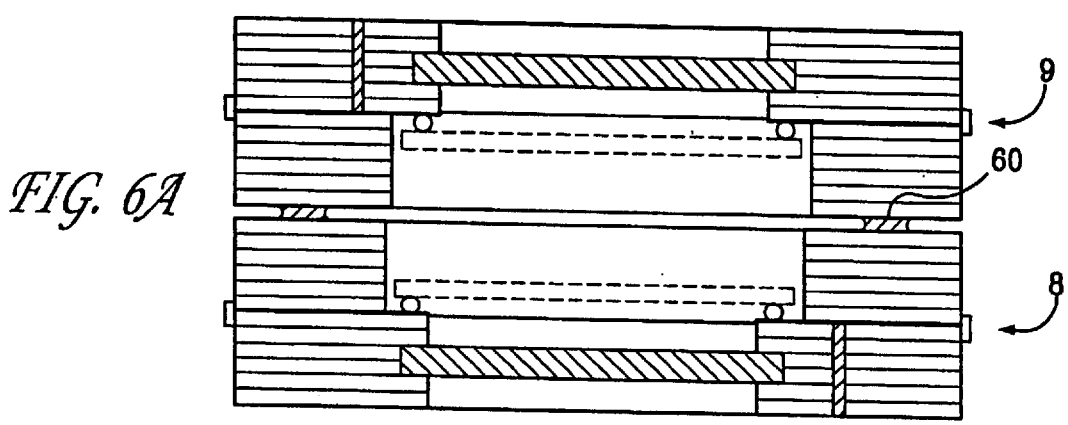
FIG. 6A shows a schematic cross-section view of another example of a microelectronic package according to the present invention that is similar to the first example of FIG. 3A, but with the cover plate removed, and also having a second package, substantially identical to the first example of FIG. 3A (also without a cover plate), where the second package has been inverted and joined to the first package, thereby forming a substantially symmetric package.

FIG. 6A shows a schematic cross-section view of another example of a microelectronic package 8 for housing at least one microelectronic device according to the present invention; further comprising a second package 9 that is substantially identical to the first example of package 8 in FIG. 3A, wherein second package 9 can be inverted and bonded with seal 60 to package 8 to form a sealed, symmetric package capable of housing at least two microelectronic devices. In this example, second package 9 serves the function of cover lid 42 (e.g. to cover and seal package 8).

Figure 6B:
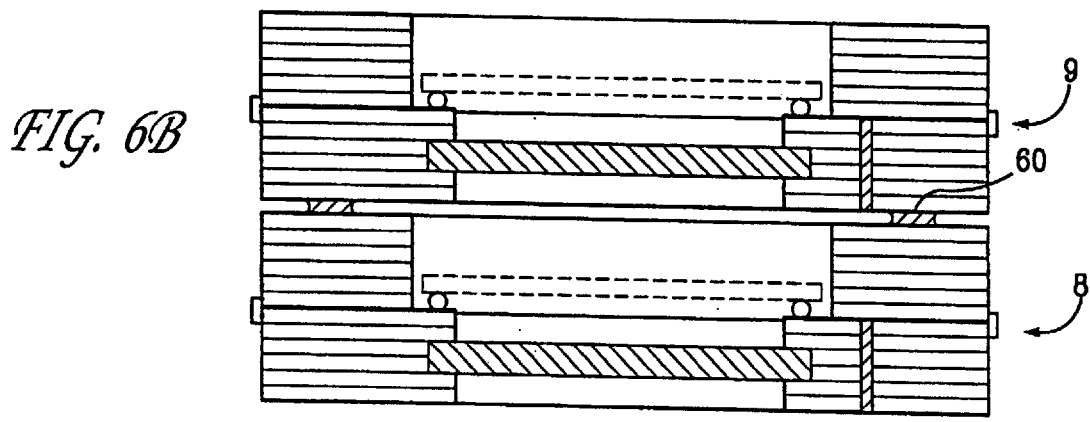
FIG. 6B shows a schematic cross-section view of another example of a microelectronic package according to the present invention that is similar to the first example of FIG. 3A, but with the cover plate removed, and also having a second package, substantially identical to the first example of FIG. 3A (also without a cover plate), where the second package has been stacked above the first package and joined to the first package, thereby forming a stacked, double-package.

FIG. 6B shows a schematic cross-section view of another example of a microelectronic package 8 for housing at least one microelectronic device according to the present invention; further comprising a second package 9 that is substantially identical to the first example of package 8 in FIG. 3A, wherein second package 9 can be stacked and bonded with seal 60 to package 8 to form a stacked double-package capable of housing at least two microelectronic devices.

Figure 6C:
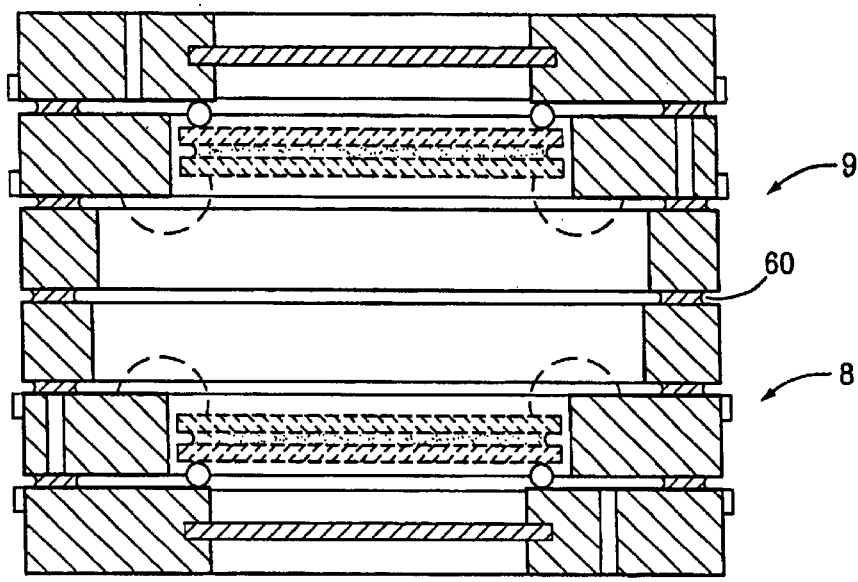
FIG. 6C shows a schematic cross-section view of another example of a microelectronic package according to the present invention that is similar to the sixth example of FIG. 5, but with the cover plate removed, and also having a second package, substantially identical to the first example of FIG. 5 (also without a cover plate), where the second package has been inverted and joined to the first package, thereby forming a substantially symmetric package.

FIG. 6C shows a schematic cross-section view of another example of a microelectronic package 8 for housing at least one microelectronic device according to the present invention; further comprising a second package 9 that is substantially identical to the sixth example of package 8 in FIG. 5, wherein second package 9 can be inverted and bonded with seal 60 to package 8 to form a sealed, symmetric package capable of housing at least four microelectronic devices. In this example, second package 9 serves the function of cover lid 42 (e.g. to cover and seal package 8).

Figure 6D:
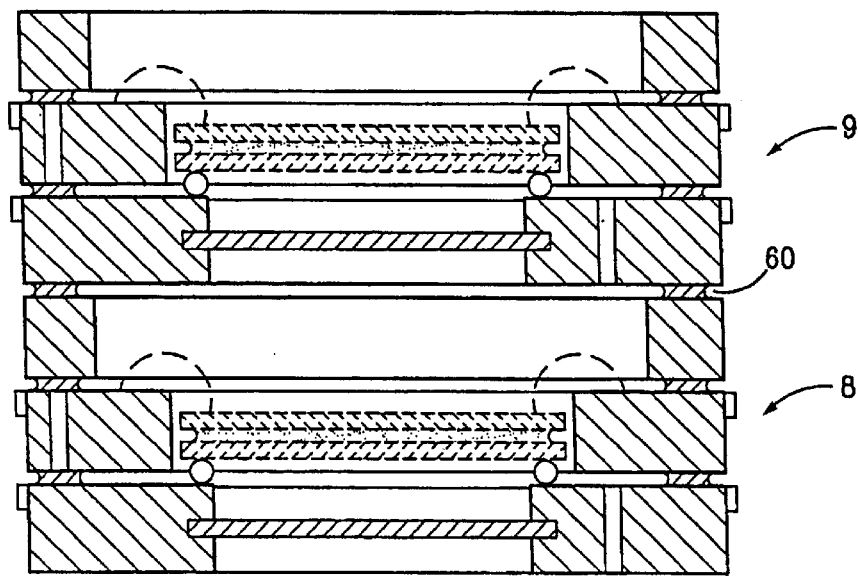
FIG. 6D shows a schematic cross-section view of another example of a microelectronic package according to the present invention that is similar to the first example of FIG. 5, but with the cover plate removed, and also having a second package, substantially identical to the first example of FIG. 5 (also without a cover plate), where the second package has been stacked above the first package and joined to the first package, thereby forming a stacked, double-package.

FIG. 6D shows a schematic cross-section view of another example of a microelectronic package 8 for housing at least one microelectronic device according to the present invention; further comprising a second package 9 that is substantially identical to the sixth example of package 8 in FIG. 5, wherein second package 9 can be stacked and bonded with seal 60 to package 8 to form a stacked double-package capable of housing at least four microelectronic devices.

Referring now to FIG. 3A, package 8 can further comprise a microelectronic device 100 mounted within assembly 10. Device 100 can be attached to surface 18. Device 100 can be flip-chip interconnected via interconnect bump 46 to metallized trace 24. Device 100 can comprise a light-sensitive device (e.g. CCD chip, photocell, laser diode, LED, optical-MEMS, or optical-IMEMS device). Light-sensitive device 100 can be mounted with a light-sensitive side 109 facing towards window 26. An optional seal 52 can be made between device 100 and first surface 18 of plate 16, after flip-chip bonding has been performed. Seal 52 can have an annular shape. Seal 52 can provide protection from particulate contamination of the optically active face of device 100 (e.g. active MEMS structures), as well as a second layer of environmental protection (in addition to third seal 50).

Referring now to FIG. 5, package 8 can further comprise a pair of microelectronic devices, 100 and 102, mounted within assembly 10. Device 100 can be attached to surface 18. Device 100 can be flip-chip interconnected via interconnect bump 46 to metallized trace 24. Second device or device 102 can be bonded to the backside of device 100 with bond 104. Methods for bonding a pair of devices back-to-back can comprise anodic bonding, gold-silicon eutectic bonding, brazing, soldering, and polymer-based adhesive attachment. Assembly 10 can further comprise a wirebonded electrical lead 106, electrically attached to metallized trace 82 and to device 102. Device 102 can include a second light-sensitive side 110 mounted face-up, e.g. facing towards cover lid 42. Although not illustrated, cover lid 42 can be attached to assembly 10 using a recessed lip similar to the recessed lip 58 shown in FIG. 4B. Cover lid 42 can be made of a transparent material. Cover lid 42 can also comprise a cofired ceramic multilayered material, which includes a cofired integral window. Alternatively, instead of joining first device 100 to second device 102 back-to-back, second device 102 can be flip-chip interconnected to metallized trace 82 disposed on surface 32 (not illustrated).

In any of the preceding examples, cover lid 42 can comprise a window for providing optical access through the opposite side of package 8 (i.e., opposite the side containing window 26).

Optional exterior electrical interconnections 112 can easily be made on the exterior surface of assembly 10, to provide means for conducting electrical signals between device 100 and device 102, as needed.

Referring now to FIG. 6C, package 8 can further comprise a first pair of devices, joined to each other back-to-back, and mounted to a first package 8, and a second pair of devices, joined to each other back-to-back, and mounted to a second package 9, wherein the second package 9 is inverted and bonded to the first package 8. In this example, a combination of flip-chip and wirebonded interconnects can be used for interconnecting the devices to the four different levels of metallized circuit traces. Also, each of the four chips or devices can comprise optically-active elements, including MEMS structures, thereby providing the possibility of passing an optical signal through both apertures by direct transmission, or by conversion of optical signals to electrical, and back to optical via the optically-active, light-sensitive devices. This can be accomplished, in part, by using exterior connections in-between the four different levels of traces 24.

FIG. 7 shows a schematic top view along line 1—1 of FIG. 3A of another example of a microelectronic package 8 for housing at least one microelectronic device according to the present invention. Multiple metallized traces 24, 24' can fan out from a smaller pitch to a larger pitch on the periphery of plate 16. Seals 48 and 52 can have the shape of an annular ring.

Figure 8:
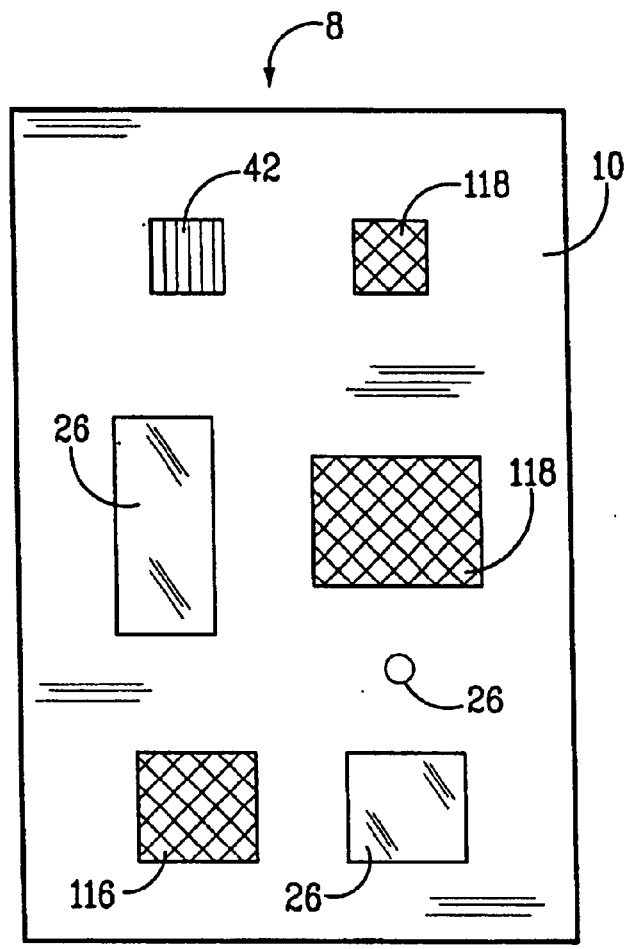
FIG. 8 shows a schematic top view of another example of a microelectronic package for housing at least one microelectronic device according to the present invention, wherein the package can be a multi-chip module (MCM), including multiple integral windows and multiple microelectronic devices in a two-dimensional array.

FIG. 8 shows a schematic top view of another example of a microelectronic package 8 for housing at least one microelectronic device according to the present invention, wherein package 8 can be a multi-chip module (MCM) having a two-dimensional planar array of microelectronic devices. In this example, package 8 includes three different compartments each having an integral window 26 disposed across an opening in the MCM. These windows can be LTCC or HTCC cofired simultaneously along with the rest of the package. Additional microelectronic devices 116 and microelectronic components 118 (e.g. capacitors, resistors, IC's) can be surface mounted to package 8 by conventional techniques, including flip-chip bonding and wirebonding. Cofired windows 26 and/or cover lids 42 can be placed on either side, or both, of the MCM package 8. Multiple light-sensitive chips or devices can be mounted inside of the multiple windowed compartments.

Figure 9:
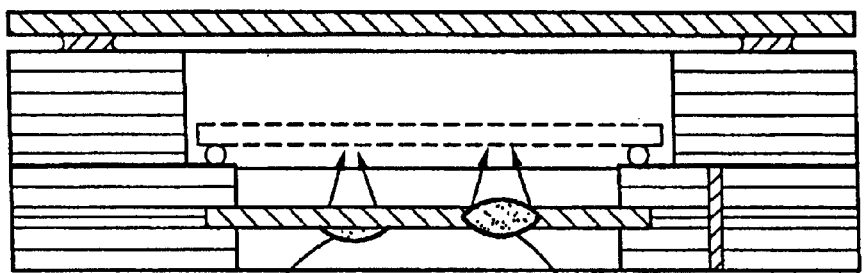
FIG. 9 shows a schematic cross-section side view of another example of a microelectronic package for housing at least one microelectronic device according to the present invention, wherein the window further comprises a lens for optically transforming light passing through the window.

FIG. 9 shows a schematic cross-section side view of another example of a microelectronic package 8 for housing at least one microelectronic device according to the present invention, wherein window 26 further comprises a lens 96 for optically transforming light passing through the window. Lens 96 (illustrated in FIG. 9 as a convex lens) can be used for focusing or concentrating light onto a smaller, or specified, area on device 100. Alternatively, lens 96 can be convex for spreading light, (or combinations of concave and convex, as is well-known in optical lens technology). Lens 96 can be formed integrally with window 26, or can be attached separately to the surface of window 26, as illustrated with lens 98. More than one lens 96 (or lens 98) could be integrated with window 26, with each lens having different optical properties. Alternatively, a divergent lens 96 can be used to spread the light.

Alternatively, window 26 can comprise an array of binary optic lenslets. Binary optics technology is the application of semiconductor manufacturing methods to the fabrication of optics. A lens or lens array is laid out on a computer CAD program and transferred to a photo-mask using an e-beam or other writing process. A series of photo-masks are used, in conjunction with various etch steps, to build up the structures of interest. This fabrication technique can be used to make arrays of lenses with 1 micron features in completely arbitrary patterns. Lenslet arrays are straightforward to make with these methods, and can be extremely high quality with no dead space between elements. The advantage of binary optics is that the optical fabrication is not limited to spheres and simple surfaces. Lenslet arrays can be effectively used to performing optical remapping, such as transforming a round aperture into a square pupil. More details on the utility and methods for fabricating binary optic lenslet arrays can be found in U.S. Pat. No. 5,493,391 to Neal and Michie; as well as U.S. Pat. No. 5,864,381 by Neal and Mansell; both of which are incorporated herein by reference.

The present invention can also comprise an electrically-switched optical modulator attached to the package (not shown). Alternatively, window 26 can be an at electrically-switched optical modulator, such as a lithium niobate or lithium tantalate window. In the example of a lithium niobate window, application of voltages around 5–6 Volts can switch the material from being transparent to being opaque, at a frequency of a few billion times per second. Metallized conductive traces embedded in the multilayered material (i.e., LTCC) of plate 16 (or sub-stack 16') can be used to energize and control the transparency of the lithium niobate/tantalate window. Such an active window can be used as a very fast shutter to control the amount of light being transmitted through window 26. More details about use of lithium niobate as a light modulation device can be found in U.S. Pat. No. 5,745,282 to Negi, which is incorporated herein by reference.

Figure 10A:
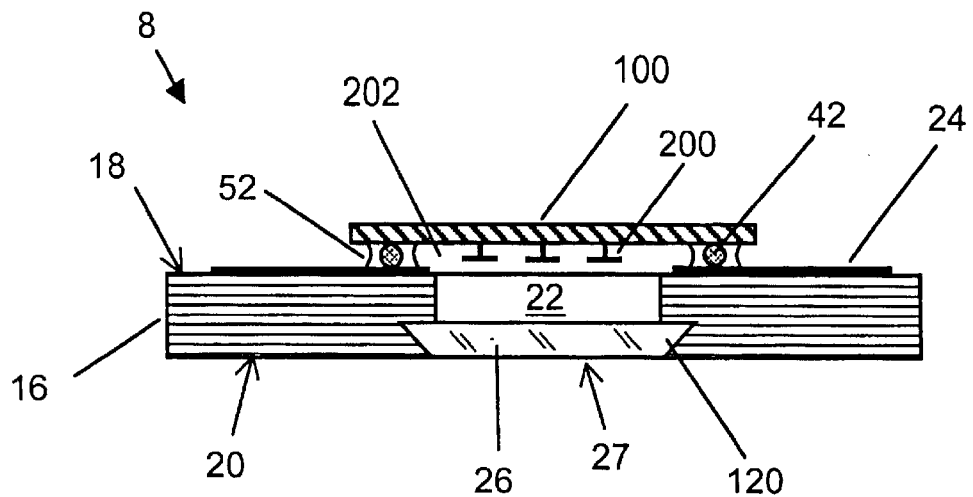
FIG. 10A shows a schematic cross-section side view of another example of a microelectronic package for housing a microelectronic device, according to the present invention.

FIG. 10A shows a schematic cross-section side view of another example of a package 8 for housing a microelectronic device 100, according to the present invention. Package 8 comprises an electrically insulating plate 16 having a first surface 20, an opposing second surface 18, and an aperture 22 disposed through the plate; an electrical conductor 24 disposed on second surface 18; and an integral window 26 disposed across and covering aperture 22. Integral window 26 is bonded directly to plate 16 without having a separate layer of adhesive material disposed in-between window 26 and plate 16. Plate 16 can comprise a multilayered material, such as a low-temperature (LTCC) or high-temperature (HTCC) cofired ceramic multilayer; or can comprise a co-bonded printed wiring board (PWB) composition. The outside face 27 of window 26 can be mounted flush with first surface 20 of plate 16, and locks into a tapered, recessed groove in plate 16. Window 26 has a tapered edge 120 where the angle and orientation of the taper is appropriately chosen so that the window is locked into place (i.e., the window geometry is self-locking). Microelectronic device 100 is flip-chip interconnected to conductor 24. Conductor 24 can comprise a thick-film or thin-film (e.g., sputtered, PVD, or CVD deposited) metallized trace; or can comprise a thicker electrical lead (e.g., TAB leadframe). A polymer-based underfill 52 can surround the conductive interconnects 42 (gold, solder, or conducting polymer balls, bumps, or pads) to support and strengthen the flip-chip joint. Underfill 52 can be applied to the flip-chip interconnects 42, or elsewhere underneath device 100, to form a continuous ring seal around the periphery of aperture 22, which prevents particulate contamination from entering cavity 202 and interfering with microelectronic device 100, including damaging any MEMS structures 200 that may be present on microelectronic device 100. Optionally, the outer edge of window 26 can be thick or thin-film metallized (or otherwise coated) with a metal or metal alloy to enhance the quality of bonding of window 26 with plate 16. With the self-locking (tapered) geometry of window 26 shown in this example, then window 26 has to be cofired or cobonded simultaneously with multilayered plate 16.

Figure 10B:
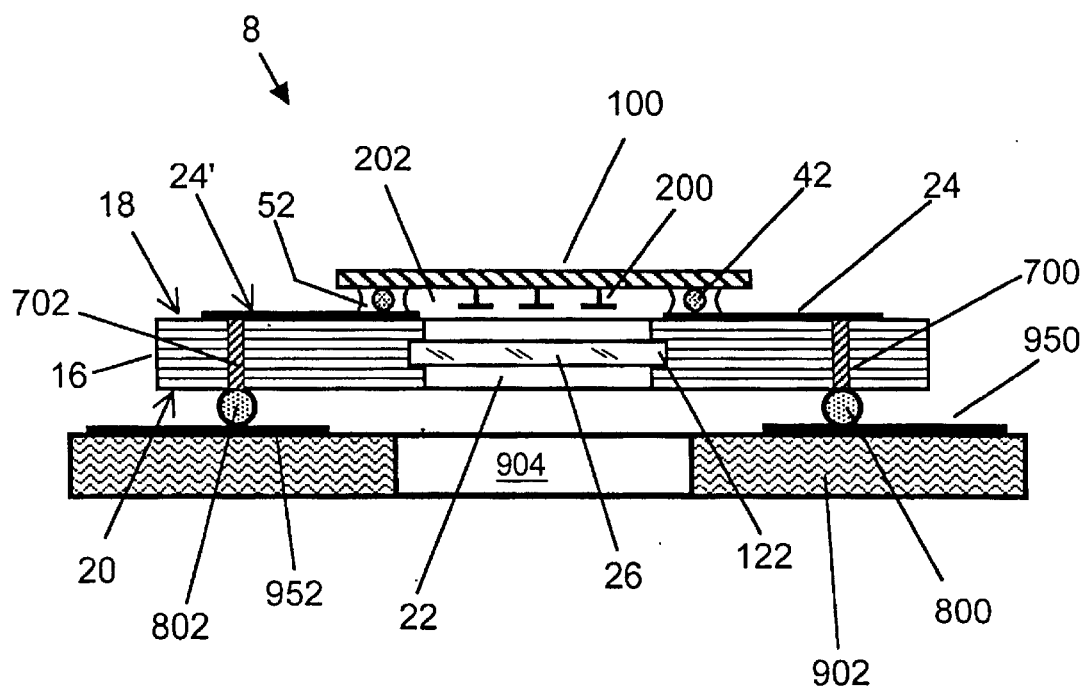
FIG. 10B shows a schematic cross-section side view of another example of a microelectronic package for housing a microelectronic device, according to the present invention.

FIG. 10B shows a schematic cross-section side view of another example of a package 8 for housing a microelectronic device 100, according to the present invention. Package 8 comprises an electrically insulating plate 16 having a first surface 20, an opposing second surface 18, and an aperture 22 disposed through the plate; an electrical conductor 24 disposed on second surface 18; and an integral window 26 disposed across aperture 22. Window 26 is bonded directly to plate 16 without having a separate layer of adhesive material disposed in-between window 26 and plate 16. Plate 16 can comprise a multilayered material, such as a low-temperature (LTCC) or high-temperature (HTCC) multilayer or printed wiring board (PWB) composition. The joint between window 26 and plate 16 comprises an encased joint geometry 122 (as previously discussed with reference to FIG. 3B) without having a separate layer of adhesive material disposed in-between window 26 and plate 16. Microelectronic device 100 is flip-chip interconnected to conductor 24. Conductor 24 can comprise a thick-film or thin-film (e.g., sputtered, PVD, or CVD deposited) metalized trace; or can comprise a thicker electrical lead (e.g., TAB leadframe). A polymer-based underfill 52 can surround the conductive joints 42 (solder or conducting polymer balls, bumps, or pads) to support and strengthen the flip-chip joint. Underfill 52 can be applied to the flip-chip interconnects 42, or elsewhere underneath device 100, to form a continuous ring seal around the periphery of aperture 22, which prevents particulate contamination from entering cavity 202 and interfering with microelectronic device 100, including damaging any MEMS structures 200. Optionally, the outer edge of window 26 can be thick or thin-film metallized (or otherwise coated) with a metal or metal alloy to enhance the quality of bonding of window 26 with plate 16. With the self-locking (encased) geometry of window 26 shown in this example, then window 26 is be cofired or cobonded simultaneously with multilayered plate 16. Plate 16 further comprises conductive vias 700, 702 electrically connected to conductors 24, 24' and to solder balls 800, 802, respectively. Solder balls 800 and 802 form a Ball Grid Array (BGA) that is used to electrically and mechanically interconnect vias 700 and 702 to conductors 950 and 952, respectively, which are disposed on printed wiring board 902. Printed wiring board 902 comprises an opening 904 for providing open access to window 26.

Figure 10C:
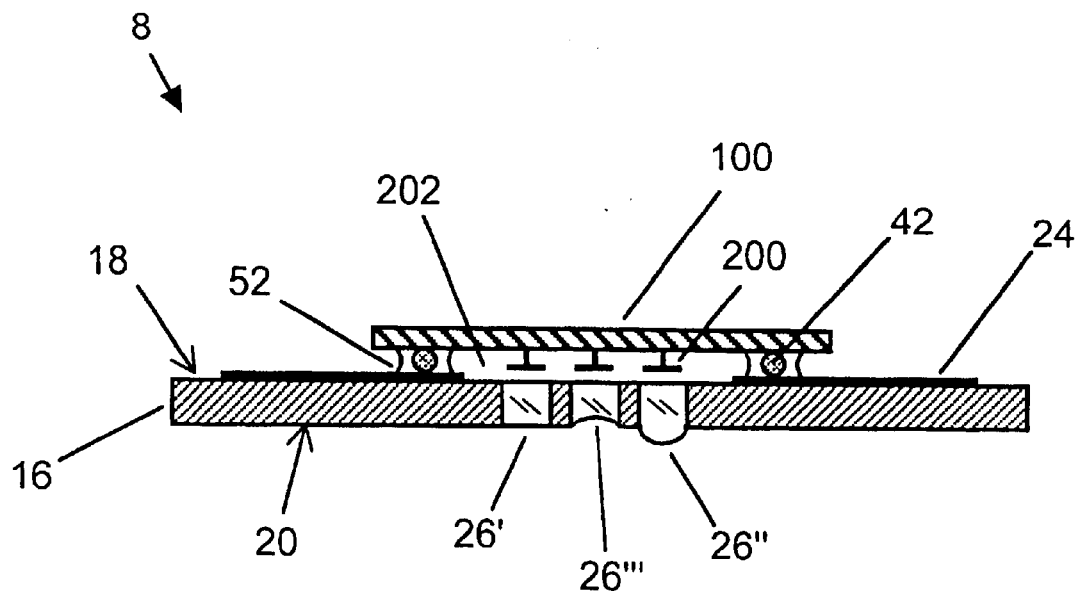
FIG. 10C shows a schematic cross-section side view of another example of a microelectronic package for housing a microelectronic device, according to the present invention.

FIG. 10C shows a schematic cross-section side view of another example of a package 8 for housing a microelectronic device 100, according to the present invention. Package 8 comprises an electrically insulating plate 16 having a first surface 20, an opposing second surface 18, and three apertures 22', 22", 22'" disposed through the plate; an electrical conductor 24 disposed on second surface 18; and three integral windows 26', 26", 26'" that substantially fills apertures 22', 22", 22'", respectively.

Integral windows 26', 26", 26'" are bonded to plate 16 without having a separate layer of adhesive material disposed in-between windows 26', 26", 26'" and plate 16. Microelectronic device 100 is flip-chip interconnected to conductor 24. Integral windows 26', 26", 26'" can be cofired or cobonded simultaneously along with plate 16.

Integral windows 26', 26", 26'" can be fabricated optionally by casting molten glass, or by molding a transparent liquid polymer, directly into apertures 22', 22", 22'", respectively, whereupon the molten glass or clear liquid polymer solidifies or hardens upon cooling/curing. A polymer-based underfill 52 can surround the conductive interconnects 42 (gold, solder, or conducting polymer balls, bumps, or pads) to support and strengthen the flip-chip joint. Underfill 52 can be applied to the flip-chip interconnects 42, or elsewhere underneath device 100, to form a continuous ring seal around the periphery of the group of three apertures 22', 22", 22'", which prevents particulate contamination from entering cavity 202 and interfering with microelectronic device 100, including damaging any MEMS structures 200.

In FIG. 10C, window 22' has a substantially flat outer surface (with respect to surface 20); window 22" has a convex outer shape; and window 22'" has a concave outer shape. This allows window 22" to act as a convex lens for concentrating or focusing light, and allows window 22'" to act as a concave lens for spreading light.

Alternatively, with respect to FIG. 10C, apertures 22', 22", 22'" can be created by drilling, milling, or ablating (e.g., laser drilling) a hole or opening into surface 20 of cofired plate 16 (i.e., after cofiring without a window), and then substantially filling the newly created apertures 22', 22", 22'" by casting (i.e., molding) a molten glass or a transparent liquid polymer directly into apertures 22', 22", 22'", whereupon the molten glass or transparent liquid polymer solidifies or hardens upon cooling/curing. The step of casting/molding windows 26', 26", 26'" into newly created apertures 22', 22", 22'" can be performed either before or after microelectronic device 100 has been flip-chip interconnected to plate 16. In this embodiment, it is not necessary that plate 16 be made of a multilayered material; instead, plate 16 can comprise a bulk ceramic material (e.g., alumina, beryllium oxide, silicon nitride, aluminum nitride, titanium nitride, titanium carbide, or silicon carbide) when using cast molten glass window, or a bulk dielectric material (e.g., plastic) when using a molded transparent liquid polymer window.

Figure 10D:
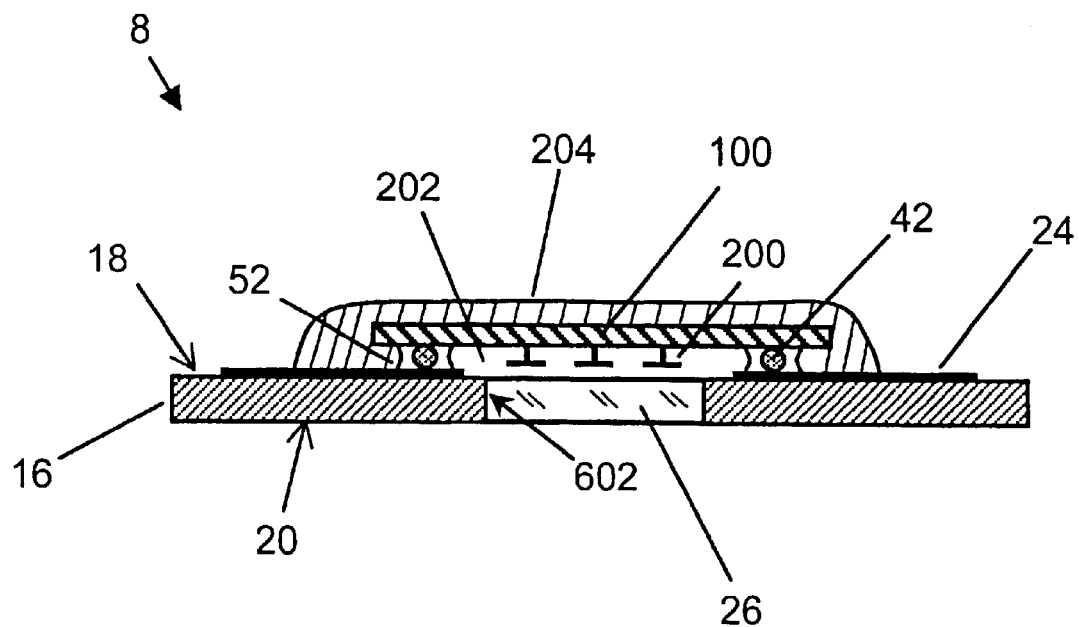
FIG. 10D shows a schematic cross-section side view of another example of a microelectronic package for housing a microelectronic device, according to the present invention.

FIG. 10D shows a schematic cross-section side view of another example of a package 8 for housing a microelectronic device 100, according to the present invention. Integral window 26 substantially fills aperture 22. A polymer encapsulant 202 has been applied on the backside of microelectronic device 100 and spilling over on to part of the electrical conductors 24. Polymer encapsulant 202 can be, for example, a glob-top type polymer, or epoxy used in well-known surface mount technology. The glob-top type polymer or epoxy encapsulant 202 can be the same material as the polymer underfill 52. Alternatively, a solid protective cover (not shown) can be bonded to plate 16 that covers and protects the microelectronic device 100, instead of (or, in addition to) encapsulating device 100 with a glob-top polymer. Optionally, the outer edge of window 26, or the inner surface 602 of aperture 22, an be thick-film or thin-film metallized (or otherwise coated) with a metal or metal alloy to enhance the quality of bonding of window 26 with plate 16.

In FIG. 10D, window 26 can be attached to plate 16 by brazing or soldering window 26 to plate 16 after plate 16 has been fabricated with aperture 22, but before microelectronic device 100 is flip-chip interconnected to plate 16. In this sense, window 26 is made integral with plate 16 prior to mounting microelectronic device 100. Window 26 is attached to plate 16 without having a separate layer of adhesive material disposed in-between window 26 and plate 16. Optionally, the outer edge of window 26 can be thick or thin-film metallized (or otherwise coated) with a metal or metal alloy to enhance the quality of brazing or soldering of window 26 to plate 16. In this embodiment, it is not necessary that plate 16 be made of a multilayered material; instead, plate 16 can comprise a bulk ceramic material (e.g., alumina, beryllium oxide, silicon nitride, aluminum nitride, titanium nitride, titanium carbide, or silicon carbide). In this case, the inner wall 602 of bulk ceramic plate 16 defining aperture 22 can be metallized prior to brazing or soldering to promote wetting and enhance bonding.

Figure 11:
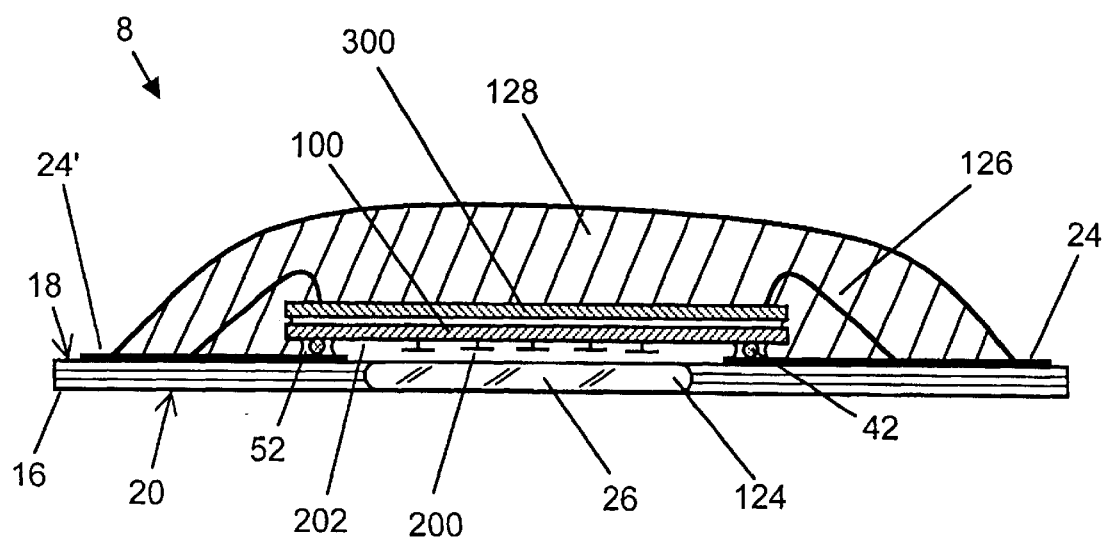
FIG. 11 shows a schematic cross-section side view of another example of a microelectronic package for housing a microelectronic device, according to the present invention.

FIG. 11 shows a schematic cross-section side view of another example of a package 8 for housing a pair of back-to-back microelectronic devices 100 and 300, according to the present invention. Package 8 comprises an electrically insulating plate 16 having a first surface 20, an opposing second surface 18, and an aperture 22 disposed through the plate; a first electrical conductor (or conductors) 24 disposed on second surface 18; and an integral window 26 substantially filling aperture 22. Integral window 26 is bonded directly to plate 16 without having a separate layer of adhesive material (e.g., polymer-based adhesive) disposed in-between window 26 and plate 16. Window 26 can comprise a convex, rounded outer edge 124, which creates a self-locking joint. A light-sensitive first microelectronic device 100 is flip-chip interconnected to conductor 24. A second microelectronic device 300 (which may or may not be light-sensitive) is attached to the backside of the first device 100 (e.g., by eutectic die attach, polymer or conductive polymer adhesive), and interconnected to a second electrical conductor (or conductors) 24' via wirebonds 126 (e.g., gold, aluminum, or copper wirebonds). A polymer-based underfill 52 can surround the conductive interconnects 42 (gold, solder, or conducting polymer balls, bumps, or pads) to support and strengthen the flip-chip joint. Underfill 52 can be applied to the flip-chip interconnects 42, or elsewhere underneath device 100, to form a continuous ring seal around the periphery of aperture 22, which prevents particulate contamination from entering cavity 202 and interfering with microelectronic device 100, including damaging any MEMS structures 200. Optionally, the outer edge of window 26 can be thick or thin-film metallized (or otherwise coated) with a metal or metal alloy to enhance the quality of bonding of window 26 with plate 16.

Referring still to FIG. 11, a polymer-based material 128 (i.e., glob-top type polymer) encapsulates the two back-to-back devices 100,300, the wirebonds, the underfill polymer 52 and part of the electrical traces 24, 24'. The function of polymer encapsulant 128 is to protect the microelectronic devices and wirebonds from mechanical damage, and to reduce exposure to moisture (although some polymers are permeable to water). Polymer encapsulant 128 can comprise an optically, IR, or UV transparent material (e.g., if device 300 has a light-sensitive facing up). The polymer underfill material 52 and the polymer encapsulant material 128 can be the same material. Use of the same polymer allows both steps (i.e., underfill and encapsulation) to be performed in a single, continuous step.

Since polymers can absorb water and allow water to permeate through them, the package 8 shown in FIG. 11 could subsequently be mounted inside of a second, outer hermetic package with an integral window (not shown). The polymer encapsulant 128 can be dried by baking before mounting inside the hermetic outer package.

Figure 12A:
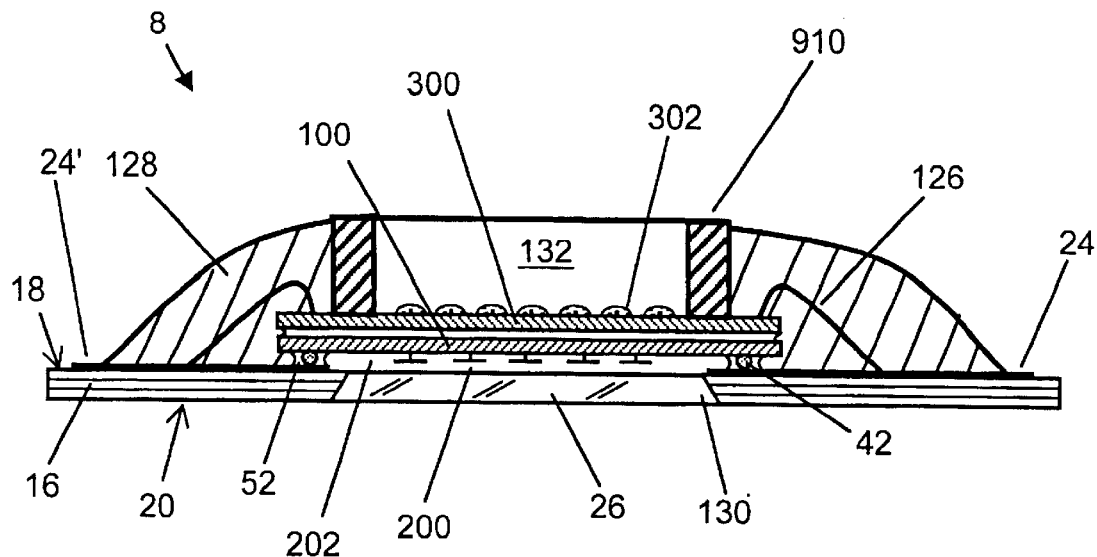
FIG. 12A shows a schematic cross-section side view of another example of a package for housing a pair of back-to-back microelectronic devices, according to the present invention.

FIG. 12A shows a schematic cross-section side view of another example of a package 8 for housing a pair of back-to-back microelectronic devices 100 and 300, according to the present invention. In this example, the second microelectronic device 300 comprises sensor elements 302 (e.g., chemically-sensitive chemiresistors, SAW sensors; pressure-sensitive elements; or temperature/heat-sensitive elements). An opening 132 has been created in polymer encapsulant 128 for providing free and open access to sensor elements 302. Opening 132 does not extend, however, beyond a width that would expose wirebonds 126. A variety of techniques can be employed to create aperture 132. Some of these techniques are disclosed in allowed U.S. patent application Ser. No. 09/572,720 to Peterson and Conley, "Pre-Release Plastic Packaging of MEMS and IMEMS Devices", which is incorporated herein by reference. One technique illustrated in FIG. 12*a* is to use a dam 910 (e.g., a polymer ring) placed or otherwise fabricated on top of second microelectronic device 300. Then, after wirebonds 126 have been made, a glob-top polymer encapsulant 128 is poured or otherwise dispensed into the region outside of dam 910 and around wirebonds 126 to encapsulate and protect them. Dam 910 encircles the light-sensitive structures 302 on the front side of microelectronic device 300, and prevents encapsulant 128 from flowing into and filling up the open space 132, which would occlude light-sensitive structures 302. In this way, dam 910 defines opening 132. Integral window 26 has a tapered edge 130 which is flared in a direction opposite to the example shown in FIG. 10A. In this example, tapered edge 120 does not provide a self-locking capability. Optionally, a transparent window (not shown) can be affixed to the encapsulant 128 covering opening 132.

Figure 12B:
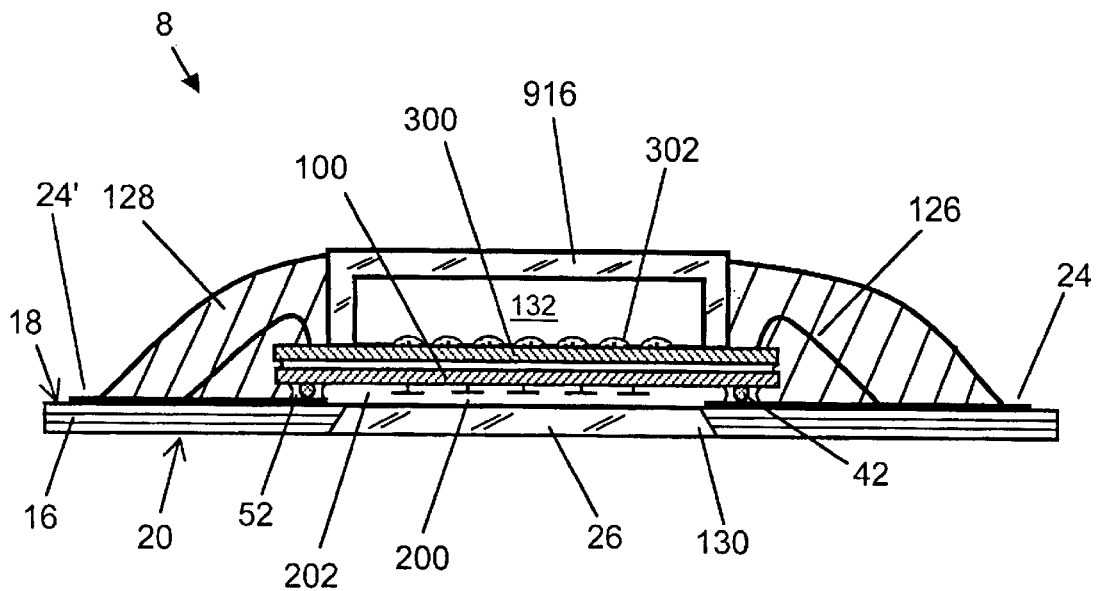
FIG. 12B shows a schematic cross-section side view of another example of a package for housing a pair of back-to-back microelectronic devices, according to the present invention.

FIG. 12B shows a schematic cross-section side view of another example of a package 8 for housing a pair of back-to-back microelectronic devices 100 and 300, according to the present invention. In this example, the second microelectronic device 300 comprises sensor elements 302 (e.g., chemically-sensitive chemiresistors, SAW sensors; pressure-sensitive elements; or temperature/heat-sensitive elements). An opening 132 has been created in polymer encapsulant 128 for providing free and open access to sensor elements 302. A U-shaped, transparent protective cap 916 is placed on top of second microelectronic device 300. Cap 916 serves as a combined cover lid and dam that both protects light-sensitive structures 302 on the front side of microelectronic device 300 and prevents encapsulant 128 from flowing into and filling up by open space 132, which would occlude light-sensitive structures 302. After wirebonds 126 have been made, a glob-top polymer encapsulant 128 is poured or otherwise dispensed into the region outside of cap 916 and around wirebonds 126 to encapsulate and protect them. Optionally, transparent cap 916 can be curved or otherwise shaped as a lens to concentrate, focus, or spread light passing through it. Integral window 26 has a tapered edge 130 which is flared in a direction opposite to the example shown in FIG. 10A. In this example, tapered edge 120 does not provide a self-locking capability. Optionally, a transparent window (not shown) can be affixed to the encapsulant 128 covering opening 132.

Figure 13:
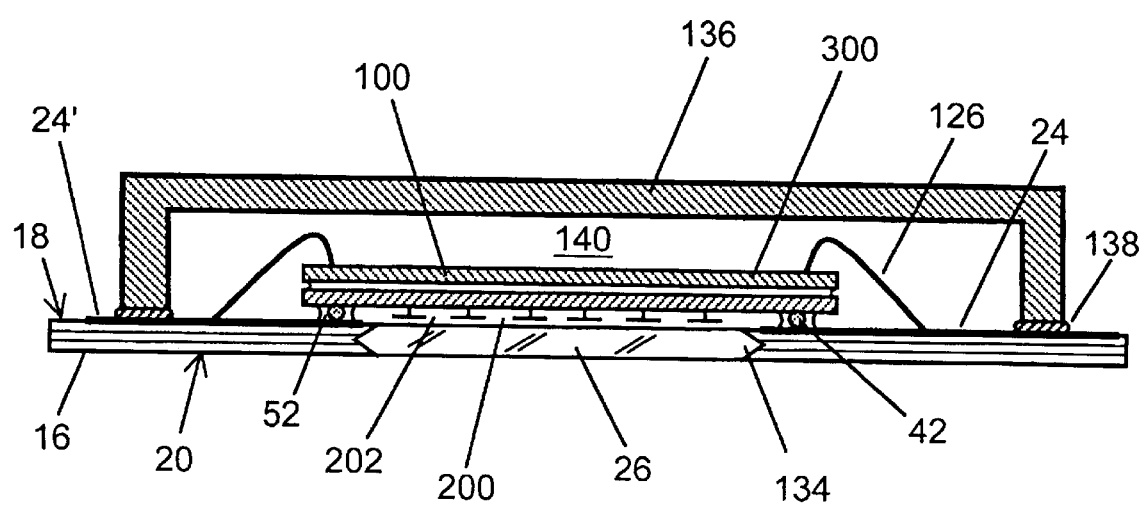
FIG. 13 shows a schematic cross-section side view of another example of a package for housing a pair of back-to-back microelectronic devices, according to the present invention.

FIG. 13 shows a schematic cross-section side view of another example of a package 8 for housing a pair of back-to-back microelectronic devices 100 and 300, according to the present invention. Integral window 26 has a chevron-shaped double-tapered outer edge 134, which provides a self-locking joint. A U-shaped protective solid cover 136 is attached to surface 18 of plate 16 with seal 138, and provides mechanical protection to both microelectronic devices and the wirebonds located underneath the cover. Cover 136 can comprise silicon, a ceramic, plastic, or metallic material, or a composite material. Additionally, cover 136 can be made of a transparent material, such as glass or a transparent plastic. Seal 138 can be a hermetic seal comprising a braze, glass, solder, or anodically bonded joint. Alternatively, seal 138 can comprise an adhesive joint comprising a polymer-based material (e.g., epoxy, silicone, etc.), depending on the requirements for hermeticity and mechanical strength. Wirebond 126 can be coated with a protective layer of parylene.

Figure 14A:
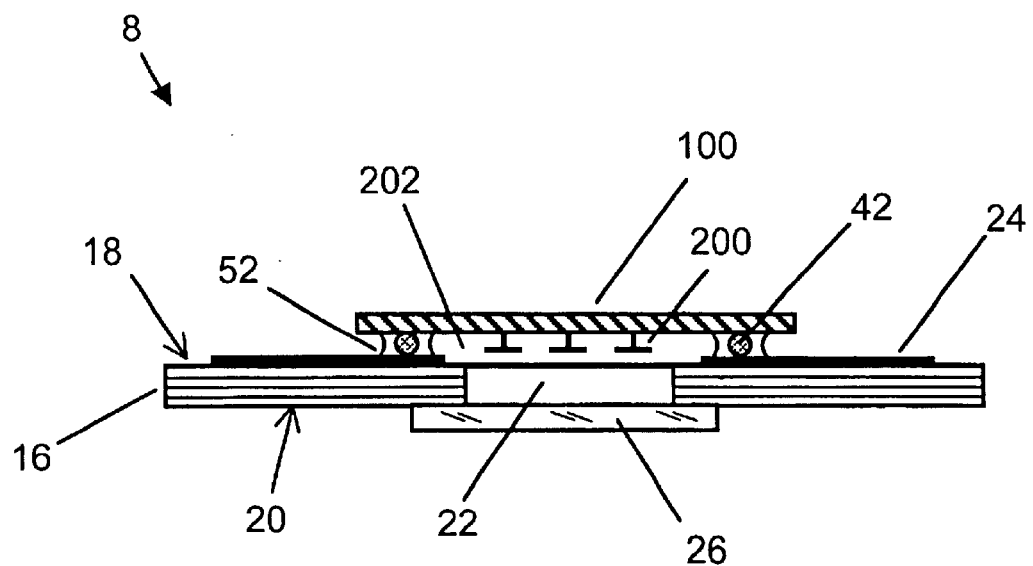
FIG. 14A shows a schematic cross-section side view of another example of a microelectronic package for housing a microelectronic device, according to the present invention.

FIG. 14A shows a schematic cross-section side view of another example of a package 8 for housing a microelectronic device 100, according to the present invention. Package 8 comprises a electrically insulating plate 16 having a first surface 20, an opposing second surface 18, and an aperture 22 disposed through the plate; an electrical conductor 24 disposed on second surface 18; and an integral window 26 disposed across and covering aperture 22. Integral window 26 is bonded directly to plate 16 without having a separate layer of adhesive material disposed in-between window 26 and plate 16. Plate 16 can comprise a multilayered material, such as a low-temperature (LTCC) or high-temperature (HTCC) cofired ceramic multilayer or a co-bonded printed wiring board (PWB) composition. Window 26 is mounted on the first surface 20 of plate 16 and extends laterally along the first surface 20 a sufficient distance beyond the periphery of aperture 22 to provide a sufficiently large overlapping area to provide a sufficiently high bond strength. If LTCC or HTCC materials are used to make plate 16, then glass-forming compounds in the LTCC or HTCC green ceramic tape can melt and flow during firing, thereby bonding and integrating (i.e., cofiring) window 26 to ceramic plate 16. This creates a hermetic seal between window 26 and plate 16. Microelectronic device 100 is flip-chip interconnected to conductor 24. Conductor 24 can comprise a thick-film or thin-film (e.g., sputtered, PVD, or CVD deposited) metallized trace; or can comprise a thicker electrical lead (e.g., TAB leadframe). A polymer-based underfill 52 can surround the conductive interconnects 42 (gold, solder, or conducting polymer balls, bumps, or pads) to support and strengthen the flip-chip joint. Underfill 52 can be applied to the flip-chip interconnects 42, or elsewhere underneath device 100, to form a continuous ring seal around the periphery of aperture 22, which prevents particulate contamination from entering cavity 202 and interfering with microelectronic device 100, including damaging any MEMS structures 200. Flip-chip bonding of microelectronic device 100 to plate 16 occurs after window 26 has been bonded to plate 16 to form an integral window. Since the light-sensitive side of microelectronic device 100 faces window 26 during flip-chip bonding, any fragile released MEMS structures 200 are not exposed to potentially harmful particulate contamination.

In FIG. 14A, window 26 can alternatively be attached to plate 16 by brazing or soldering window 26 to plate 16 after plate 16 has been fabricated with aperture 22, but before microelectronic device 100 is flip-chip interconnected to plate 16. In this sense, window 26 is made integral with plate 16 prior to mounting microelectronic device 100. Window 26 is attached to plate 16 without having a separate layer of adhesive material disposed in-between window 26 and plate 16. Optionally, the outer edge of window 26 can be thick or thin-film metallized (or otherwise coated) with a metal or metal alloy to enhance the quality of brazing or soldering of window 26 to plate 16. In this embodiment, it is not necessary that plate 16 be made of a multilayered material; instead, plate 16 can comprise a bulk ceramic material (e.g., alumina, beryllium oxide, silicon nitride, aluminum nitride, titanium nitride, titanium carbide, or silicon carbide). In this case, the inner wall 602 of bulk ceramic plate 16 defining aperture 22 can be metallized prior to brazing or soldering to promote wetting and enhance bonding.

Figure 14B:
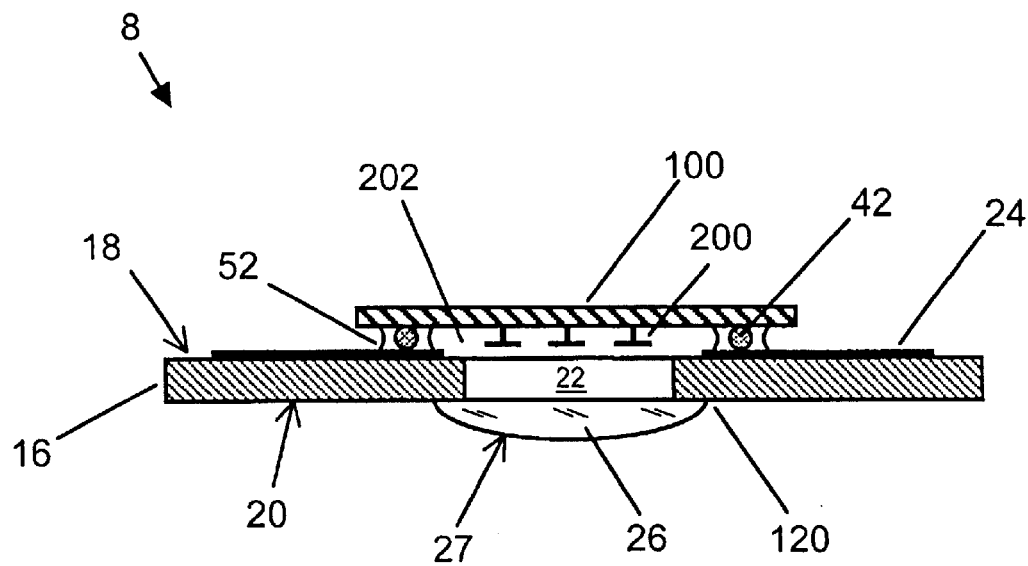
FIG. 14B shows a schematic cross-section side view of another example of a microelectronic package for housing a microelectronic device, according to the present invention.

FIG. 14B shows a schematic cross-section side view of another example of a package 8 for housing a microelectronic device 100, according to the present invention. Window 26 is mounted on the first surface 20 of plate 16 and extends laterally along the first surface 20 a sufficient distance along first surface 20 beyond the periphery of aperture 22 to provide a sufficiently large overlapping area to provide a sufficiently high bond strength. Plate 16 can comprises silicon (e.g., a silicon wafer). Window 26 can comprise glass (e.g., PYREX™). In this case, window 26 can be anodically bonded directly to silicon plate 16 without using any intermediate layer (e.g., polymer adhesive, solder, braze, etc.). Alternatively, window 26 can comprise a coating of glass on a substrate not made of glass, in which case it is the glass coating on widow 26 that is anodically bonded to (silicon) plate 16. Window 26 can have a convex, curved outer surface 27 to act as a lens for concentrating or focusing light passing through window 26.

Anodic bonding, also called field assisted glass-silicon sealing, is a process that permits the joining of silicon to glass at a temperature well below the softening point of the glass. The two surfaces to be bonded together should be smooth (i.e., having a surface roughness of less than about 0.1 microns) to allow the surfaces to mate closely. The pieces to be bonded are assembled and heated on a hot plate in a room atmosphere to a temperature between about 300–500 C. A direct current power supply is connected to the assembly such that the silicon plate 16 is positive with respect to the is glass (or glass-coated) window 26. When a voltage in the range of about 50 to 1500 V is applied across the assembly, the glass bonds to the silicon member. The bonding mechanism involved is attributed to mobile ions in the glass. At lower temperatures, a higher voltage is required. After the voltage is removed the structures are held together by a irreversible chemical bond. The outer edge 120 of window 26 can be tapered outwardly at an angle to reduce stress concentrations at the corner of the window next to plate 16. Microelectronic device 100 is flip-chip interconnected to conductor 24 after window 26 has been anodically bonded directly to plate 16.

Figure 14C:
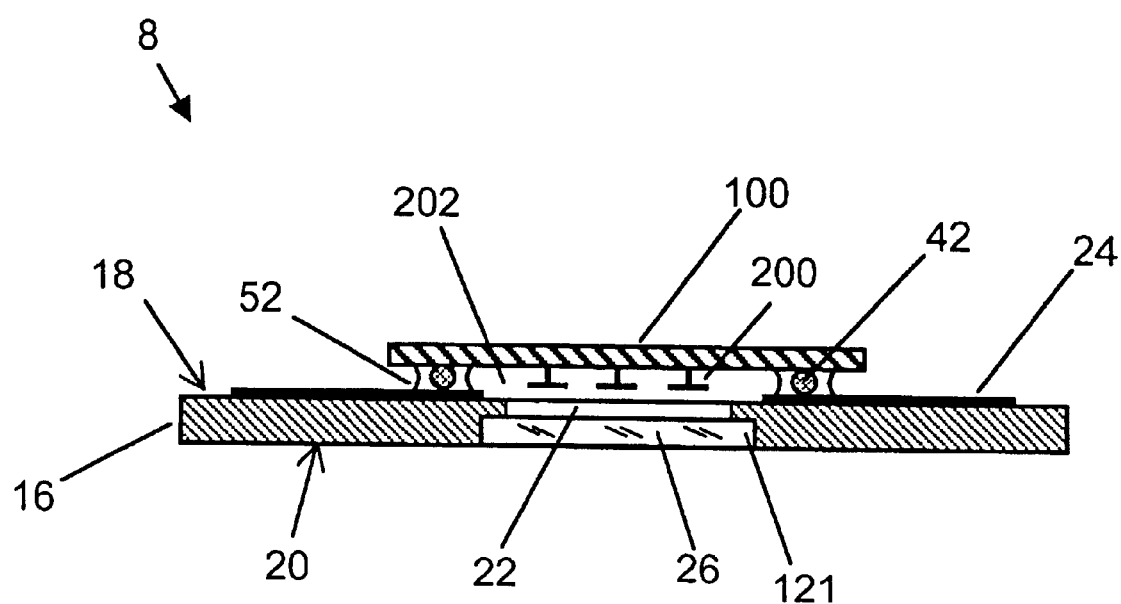
FIG. 14C shows a schematic cross-section side view of another example of a microelectronic package for housing a microelectronic device, according to the present invention.

FIG. 14C shows a schematic cross-section side view of another example of a package 8 for housing a microelectronic device 100, according to the present invention. Integral window 26 is bonded directly to plate 16 without having a separate layer of adhesive material disposed in-between window 26 and plate 16. Plate 16 can comprise silicon (e.g., silicon wafer). The rectangular outer edge 121 of window 26 rests inside of a recessed lip within plate 16 that surrounds the periphery of aperture 22. Window 26 can comprise glass (e.g., PYREX™), which allows it to be anodically bonded directly to silicon plate 16 without using any intermediate layer. Microelectronic device 100 is flip-chip interconnected to conductor 24 after window 26 has been anodically bonded directly to plate 16. Alternatively, window 26 can be brazed or soldered to plate 16 prior to mounting microelectronic device 100.

As discussed previously (with respect to FIGS. 10–14), polymer underfill 52 can be applied in a manner so as to form a continuous ring seal in-between device 100 and plate 16, around the periphery of aperture 22. Since window 26 has been previously bonded (and, hence, sealed) to plate 16 during fabrication of the integrated windowiplate combination, application of polymer underfill 52 to form a continuous ring seal causes cavity 202 to be sealed and isolated from the external environment. In this case, prior to sealing up cavity 202 with polymer underfill ring seal 52, the ambient atmosphere (i.e., air) inside of cavity 202 can be substantially removed and replaced with at least one gas other than air. This other gas can include an inert gas (e.g. argon, nitrogen, or helium). Helium can be easily detected by a conventional helium leak detector, thereby providing information on the hermetic quality of the joints and seals in by package 8. The level of humidity can also be adjusted (i.e., reduced) prior to sealing cavity 202. Likewise, cavity 140 in the example shown in FIG. 13 can have its ambient atmosphere replaced with another gas, or humidity level adjusted, prior to attaching cover 136 with seal 138.

Figure 15A:
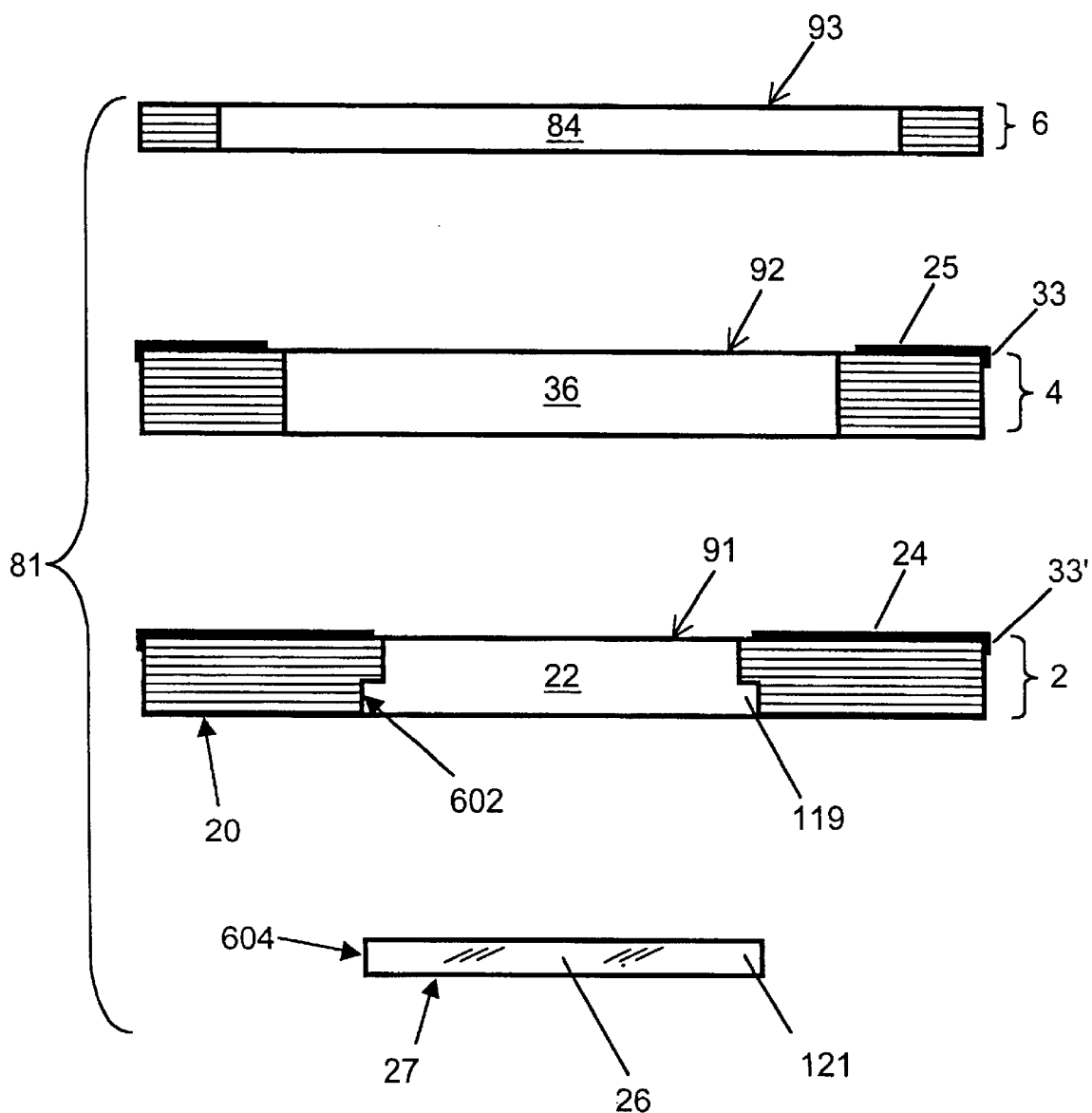
FIG. 15A shows a schematic exploded cross section side view of another example of a by package for housing a pair of microelectronic devices, according to the present invention.

FIG. 15A shows a schematic exploded cross-section side view of another example of a package 8 for housing a pair of microelectronic devices, according to the present invention. Four sub-stacks 2, 4, 6 and window 26 are illustrated in their exploded positions prior to being stacked (i.e., collated) registered, and processed to make a consolidated, bi-level monolithic multilayered body 81. Each sub-stack comprises at least one layer (i.e., sheet or ply) of an unfired (i.e., green) ceramic tape, or unbonded polymer-based printed wiring board (PWB) material (e.g., FR4). In this example, first sub-stack 2 comprises eight layers, second sub-stack 4 comprises nine layers, and third sub-stack 6 comprises five layers. First electrical conductor 24 is disposed on the upper surface 91 of first sub-stack 2, and second electrical conductor 25 is disposed on the upper surface 92 of second sub-stack 4. No electrical conductors are disposed on the upper surface 93 of third sub-stack 6 (in this example). Electrical conductors 24, 25 can be applied as lines or traces by, for example, a thick-film screen printing or ink-jet printing process using a conductive ink or paste. A small portion of electrical conductor 25 can extends down and around the side of one or more layers to provide a bond pad 33, 33' for subsequently attaching an electrical lead (not shown) by, for example, brazing, soldering, or thermocompression bonding. Note that there is no adhesive layer disposed in-between window 26 and first sub-stack 2. Conductive vias (not shown) can be used to connect metallic traces on different layers to each other.

Referring still to FIG. 15A, each individual layer of a specific sub-stack has a cutout that defines an aperture through that sub-stack. First sub-stack 2 comprises a first aperture 22; second sub-stack 4 comprises a second aperture 36; and third sub-stack 6 comprises a third aperture 84. First aperture 22 in first sub-stack 2 comprises an recessed lip (i.e., step) 119 that matches the rectangular outer edge 121 of window 26. Third aperture 84 is wider than second aperture 36; and second apertue 36 is wider than first aperture 22. Window 26 is wider than second aperture 22. The interior sidewalls of apertures 36 and 84 are straight, while the interior sidewall of aperture 22 has a step that defines recessed lip 119 for holding window 26. In general, however, the interior sidewalls of any of these apertures can be straight, angled, stepped, or irregular to accommodate different window edge shapes; or to facilitate more open access to flip-chip interconnects, for example, for dispensing a polymer underfill.

Figure 15B:
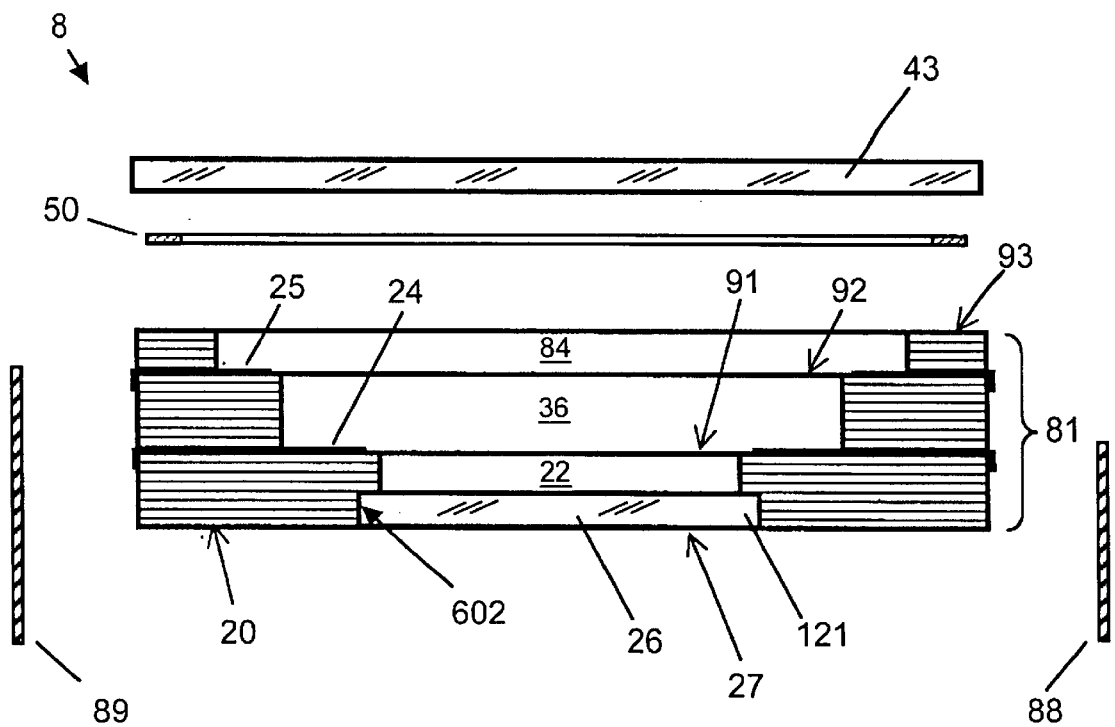
FIG. 15B shows a schematic exploded cross-section side view of the example of FIG. 15A of a package for housing a pair of microelectronic devices, according to the present invention.

FIG. 15B shows a schematic exploded cross-section side view of the example of FIG. 15A of a package 8 for housing a pair of microelectronic devices, according to the present invention. Package 8 comprises a bi-level, monolithic multilayered electrically insulating body 81 with an integral window 26. The three sub-stacks 2, 4, and 6, with window 26 placed into the recessed lip 119 of first sub-stack 2 (see FIG. 15A) have been stacked on top of each other, registered, and processed (i.e., laminated/cofired or cobonded) to make a consolidated, bi-level monolithic multilayered body 81 with an integral window 26. Electrical conductors 24 and 25 are substantially embedded within monolithic body 81. The phrase "bi-level" refers to the two levels of electrical conductors (i.e., conductor 24 disposed on first level 91, and conductor 25 disposed on second level 93). Integral window 26 is disposed across and covers second aperture 22. Integral window 26 is bonded directly to body 81 without having a separate layer of adhesive material disposed in-between window 26 and body 81. The bottom (i.e., outside) surface 27 of window 26 is coplanar with bottom surface 20 of body 81. The rectangular edge 121 of window 26 rests in, and is bonded directly to, recessed lip 119. Monolithic body 81 can comprise a multilayered material, such as a low-temperature (LTCC) or high-temperature (HTCC) cofired ceramic material; or a co-bonded printed wiring board (PWB) material. Package 8 further comprises perimeter seal 50, transparent cover lid 43, and electrical leads 88 and 89 (illustrated in exploded format).

In FIG. 15B, the inner surfaces of bi-level monolithic multilayered body 81 can be go described as a "stair-stepped" interior surface profile (in cross-section view) that has multiple levels, ledges, or steps. The example of FIG. 15B depicts two interior stepped ledges, i.e., surfaces 91 and 92. Accordingly, package 8 comprises an electrically insulating monolithic body 81 having a first surface 20, an opposing second surface 93, a stepped aperture 22 disposed through the body, and at least two interior ledges 91, 92; a first electrical conductor.24 disposed on the first interior ledge 91; a second electrical conductor 25 disposed on the second interior ledge 92; and an integral window 26 disposed across the aperture 22 and bonded directly to body 81 without having a separate layer of adhesive material disposed in-between window 26 and the body 81.

Referring still to FIGS. 15B an alternative method of fabrication will now be described. Window 26 can be attached to body 81 by brazing or soldering window 26 to body 81 after body 81 has been fabricated with aperture 22, but before microelectronic device 100 is flip-chip interconnected to body 81. In this sense, window 26 is made integral with body 81 prior to mounting microelectronic device 100. Window 26 is attached to body 81 without having a separate layer of adhesive material disposed in-between window 26 and body 81. Optionally, the outer edge 604 of window 26 (see FIG. 15A) can be thick or thin-film metallized (or otherwise coated) with a metal or metal alloy to enhance the quality of brazing or soldering of window 26 to body 81. The inner wall 602 of body 81 defining aperture 22 can be metallized prior to brazing or soldering to promote wetting and enhance bonding.

Those skilled in the art will appreciate that more than two interior stepped ledges can be fabricated in body 81 using the principles of multilayered construction described herein. In principle, there is no limit to the number of stair-steps (levels) than can be fabricated. For example, FIG. 20 (to be discussed later) illustrates an example of the present invention that comprises three interior stepped ledges (i.e., a tri-level design).

Figure 15C:
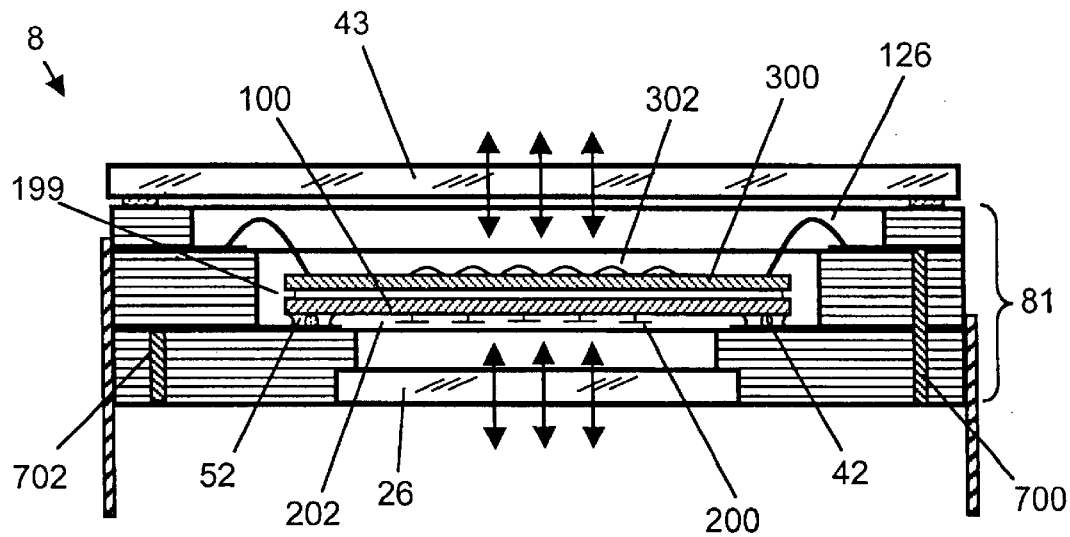
FIG. 15C shows a schematic cross section side view of the example of FIG. 15B of a package that houses a pair of microelectronic devices, according to the present invention.

FIG. 15C shows a schematic cross section side view of the example of FIG. 15B of a package 8 that houses a pair of microelectronic devices, according to the present invention. With reference to FIG. 15B, after body 81 with integral window 26 has been fabricated, then a light-sensitive first microelectronic device 100 (with MEMS structures 200 on the light-sensitive side)is flip-chip interconnected to lower conductor 24 on first level 91. A second microelectronic device 300 (which, in this example, has light-sensitive elements 302) is attached to the backside of first microelectronic device 100 (e.g., by eutectic die attach, polymer or conductive polymer adhesive), and interconnected to upper electrical conductor 25 on second level 92 by wirebond 126

(e.g., gold, aluminum, or copper wirebond). Second microelectronic device 300 can be attached to the backside of first microelectronic device 100 (i.e., back-to-back) either before or after the first microelectronic device 100 has been flip-chip interconnected to body 81. A polymer-based underfill can optionally surround the conductive flip-chip interconnects 42 (gold, solder or conducting polymer balls, bumps, or pads) to support and strengthen the flip-chip joint. The polymer underfill can be applied to the flip-chip interconnects 42, or elsewhere underneath device 100, to form a continuous ring seal 52 around the periphery of aperture 22, which prevents particulate contamination from entering cavity 202 and interfering with or damaging MEMS structures 200 on microelectronic device 100. After wirebond 126 has been made, then transparent cover lid 43 (e.g., a glass plate) can be attached to top surface 93 of body 81 with seal 50 (e.g., epoxy adhesive or solder). The ambient atmosphere inside of sealed package 8 can be replaced with a dry, inert gas (e.g., helium, neon, argon, etc.) prior to attaching cover lid 43. Electrical leads 88 and 89 are mounted on body 81 (e.g., by brazing or soldering) and are electrically connected to conductors 24 and 25, respectively. Electrical leads 88 and 89 can be attached to mounted on body 81 either prior to; during, or after cover lid 43 is attached to surface 93 of body 81, depending on the particular thermal hierarchy. Conductive vias 700, 702 can interconnect metallic traces on multiple levels, as is well-known to those skilled in the art.

The example of a package shown in FIG. 15C allows light (or other radiation) to interact with both sides of the package by passing through window 26 and transparent cover lid 43.

Figure 16:
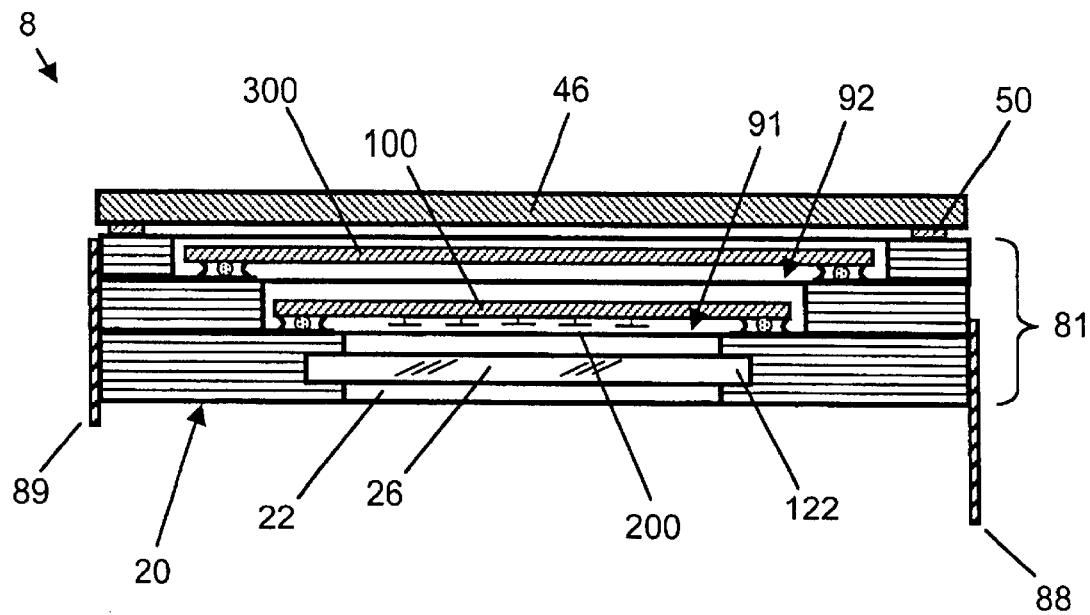
FIG. 16 shows a schematic cross section side view of another example of a package that houses a pair of microelectronic devices, according to the present invention.

FIG. 16 shows a schematic cross section side view of another example of a package 8 that houses a pair of microelectronic devices, according to the present invention. The joint between integral window 26 and body 81 comprises an encased window joint geometry 122, and does not have a separate layer of adhesive material disposed in-between window 26 and body 81. After body 81 with integral window 26 has been fabricated, then a light-sensitive first microelectronic device 100 is flip-chip interconnected to first conductor 24 on first level 91, with the light-sensitive side of device 100 facing window 26. A second microelectronic device 300 is flip-chip interconnected to second conductor 25 on second level 92. Second microelectronic device 300 can be flip-chip interconnected after first microelectronic device 100 has been flip-chip interconnected to body 81. The same solder (if solder is used) can be used for both the first flip-chip interconnections (i.e., for device 100) and the subsequent second flip-chip interconnections (i.e., for device 300) without having to worry about reflowing the first solder joints (and movement or detachment of the first device 100) due to uptake of alloying element(s) (e.g., gold) from conductor 24 during the first soldering procedure, which raises the melting point of the first soldered joints to above that of the melting point of the second solder joints (due to compositional changes in the first solder joint).

Alternatively, with respect to FIG. 16, both devices 100 and 300 can be flip-chip interconnected simultaneously. The flip-chip interconnections can be underfilled with a polymer underfill material. Lastly, cover lid 46 can be attached to upper surface 93 of body 81 with perimeter seal 50 (e.g., epoxy adhesive or solder). The ambient atmosphere inside of sealed package 8 can be replaced with a dry, inert gas prior to attaching cover lid 46.

Figure 17:
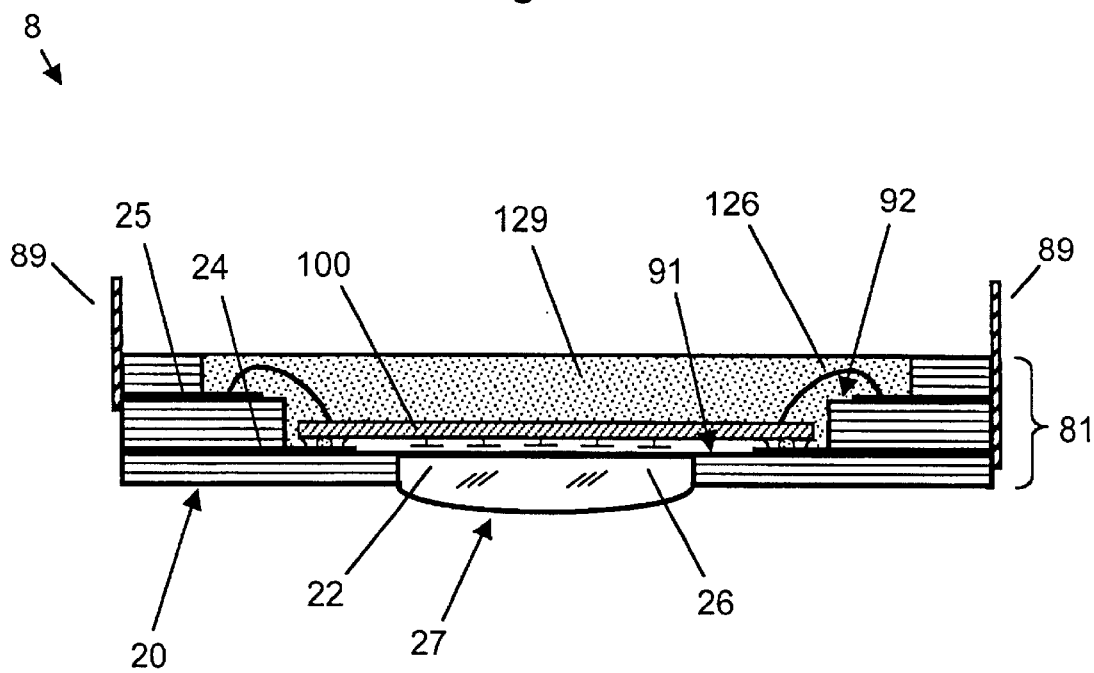
FIG. 17 shows a schematic cross section side view of another example of a package that houses a microelectronic device, according to the present invention.

FIG. 17 shows a schematic cross section side view of another example of a package 8 that houses a microelectronic device, according to the present invention. Integral window 26 is bonded directly to monolithic, bi-level body 81 without having a separate layer of adhesive material disposed in-between window 26 and body 81. Microelectronic device 100 is flip-chip interconnected to first conductor 24 on first level 91, with the light-sensitive side of device 100 facing window 26. Integral window 26 substantially fills aperture 22, and can be fabricated integrally with body 81 by casting molten glass, or by molding a transparent liquid polymer, directly into aperture 22, whereupon the molten glass or transparent liquid polymer solidifies or hardens upon cooling or curing, respectively. A second electrical interconnection can be made from the backside of microelectronic device 100 through wirebond 126 to second conductor 25 on second level 92. The open space above microelectronic device 100 can be filled with a glob-top type polymer encapsulant 129 to surround and protect wirebonds 126, and to protect and seal microelectronic device 100. Encapsulant 129 can be the same material used to make polymer ring seal 52, and can be applied at the same time (i.e., the polymer underfill step can be eliminated and replaced by the encapsulating step). Optionally, a cover lid can be attached. Window 26 can have a convex, curved outer surface 27 to act as a lens for concentrating or focusing light passing through window 26.

Figure 18:
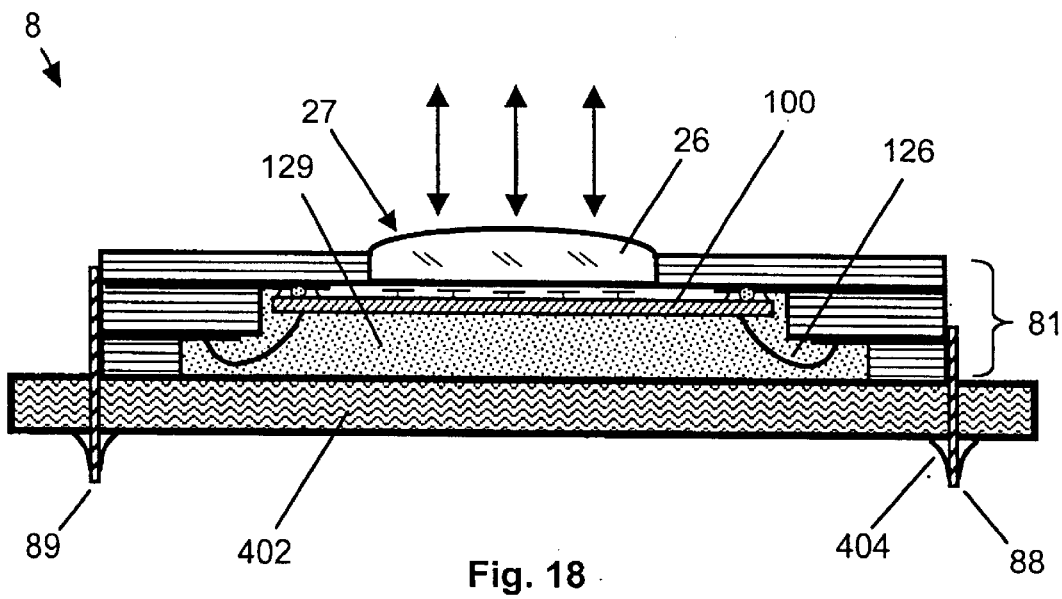
FIG. 18 shows a schematic cross section side view of the example shown in FIG. 17 mounted to a printed wiring board, according to the present invention.

FIG. 18 shows a schematic side view of the example shown in FIG. 17 mounted to a printed wiring board, according to the present invention. In this example, package 8 of FIG. 17, (including flip-chip interconnected microelectronic device 100, wirebonds 126, and encapsulant 129) has been inverted and electrical leads 88, 89 have been inserted through holes in printed wiring board 402 and connected with solder 404 on the board's lower surface. Optionally, an adhesive (not shown) can be applied in-between package 8 and printed wiring board 402 to provide additional bonding strength.

Figure 19:
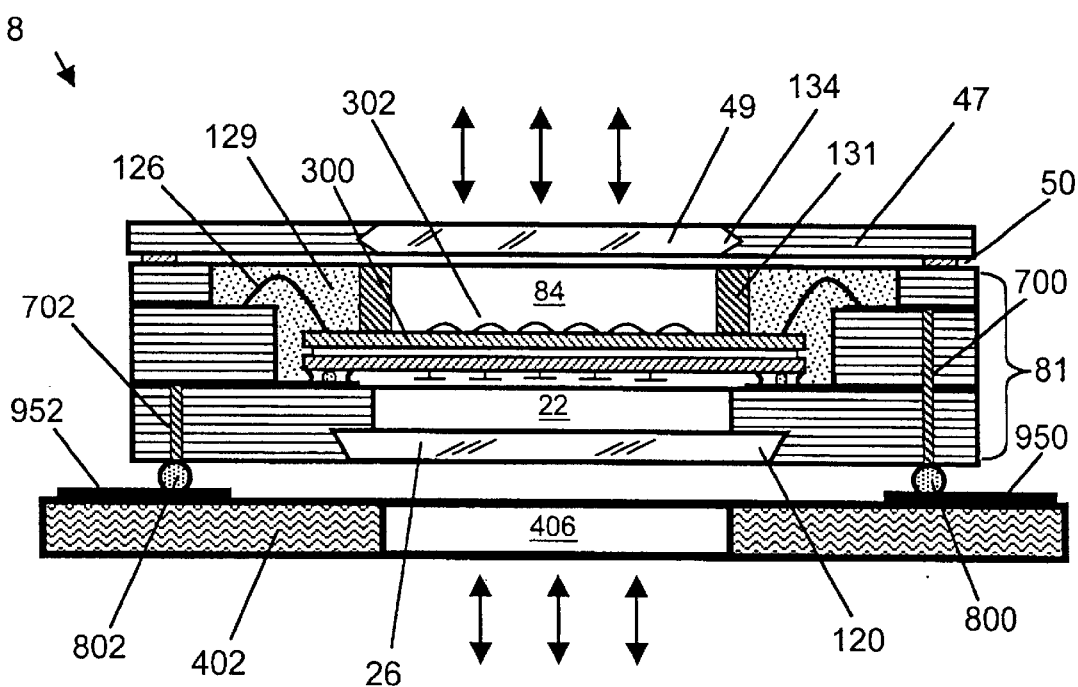
FIG. 19 shows a schematic cross section side view of another example of a package that houses a pair of microelectronic devices, which has been mounted to a printed wiring board, according to the present invention.

FIG. 19 shows a schematic side view of another example of a package 8 that houses a pair of microelectronic devices, which has been mounted to a printed wiring board, according to the present invention. Package 8 comprises a bi-level, monolithic electrically insulating body 81 with an integral window 26 disposed across and covering aperture 22. The rectangular outer edge 121 of integral window 26 rests inside of a recessed lip of body 81. Integral window 26 is bonded directly to body 81 without having a separate layer of adhesive material disposed in-between window 26 and body 81. Cover lid 47 is attached to upper surface 93 of body 81 with seal 50. Cover lid 47 can be made of a multilayered material, and can comprise a second integral window 49, which has a chevron-shaped double-tapered outer edge 134 that provides a self-locking joint. Monolithic body 81 can comprise a multilayered material, such as a low-temperature (LTCC) or high-temperature (HTCC) cofired ceramic multilayer; or a co-bonded printed wiring board (PWB) material. Alternatively, window 26 can be brazed or soldered to body 81 prior to mounting microelectronic device 100.

Referring still to FIG. 19, after body 81 with integral window 26 has been fabricated, then a light-sensitive first microelectronic device 100 with MEMS structures 200 is flip-chip interconnected to first conductor 24 on first level 91, with the light-sensitive side of device 100 facing window 26. A second microelectronic device 300 (having light-sensitive elements 302) is attached back-to-back to first microelectronic device 100 (e.g., by eutectic die attach, polymer or conductive polymer adhesive), and interconnected to second electrical conductor 25 on second level 92 via wirebond 126 (e.g., gold, aluminum, or copper wirebond). Second microelectronic device 300 can be attached to the backside of first microelectronic device 100 either before or after first microelectronic device 100 has been flip-chip interconnected to body 81. A polymer-based underfill 52 can optionally surround the interconnects 42 to support and strengthen the flip-chip joint. Underfill 52 can be applied to the flip-chip interconnects 42, or elsewhere underneath device 100, to form a continuous ring seal around the periphery of aperture 22, which prevents particulate contamination from entering damaging MEMS structures 200 on microelectronic device 100.

Referring still to FIG. 19, a dam 131 (e.g., a polymer ring) can be placed or otherwise fabricated on top of second microelectronic device 300. Next, after wirebonds 126 have been made, a glob-top polymer encapsulant 129 is poured or otherwise dispensed into the region outside of dam 131 and around wirebonds 126 to encapsulate and protect them. Dam 131 encircles the light-sensitive structures 302 on the front side of microelectronic device 300, and prevents encapsulant 129 from flowing into and filling up the open space 84, which would occlude light-sensitive structures 302. In this way, dam 131 defines opening 84. Encapsulant 129 can be the same material as underfill 52 and can be applied after the polymer underfill 52 has been applied, or simultaneously. After encapsulating the wirebonds 126, then cover lid 47 can be attached to upper surface 93 of body 81 with seal 50 (e.g., epoxy adhesive or solder). The ambient atmosphere inside of sealed package 8 can be replaced with a dry, inert gas prior to attaching cover lid 47.

Referring still to FIG. 19, body 16 further comprises conductive vias 702, 700 electrically connected to conductors 24, 25 and to solder balls 802, 800, respectively. Solder balls 800 and 802 form a Ball Grid Array (BGA) that is used to electrically and mechanically interconnect vias 700 and 702 to conductors 950 and 952, respectively, which are disposed on printed wiring board 402. Printed wiring board 402 has an opening 406 in board 402 through which light (or other energetic particles) can pass through in either direction. This geometry allows light (or other radiation) to interact with both sides of package 8. The size (i.e., width) of opening 406 can be larger, smaller, or the same size as aperture 22.

Figure 20:
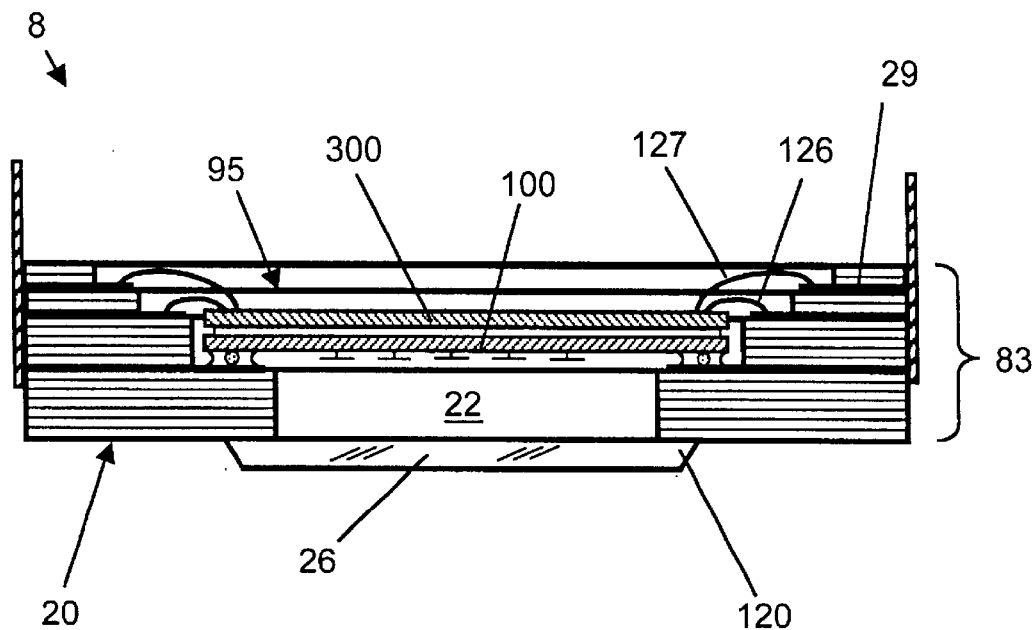
FIG. 20 shows a schematic cross section side view of another example of a package that houses a pair of microelectronic devices, according to the present invention.

FIG. 20 shows a schematic side view of another example of a package 8 that houses a pair of microelectronic devices, according to the present invention. Package 8 comprises a tri-level, monolithic electrically insulating body 83 with an integral window 26 disposed across and covering aperture 22. Window 26 is mounted on the first surface 20 of body 83 and extends laterally along the first surface 20 a sufficient distance beyond the periphery of aperture 22 to provide a sufficiently large overlapping area to provide a sufficiently high bond strength. If LTCC or HTCC materials are used to make body 83, then glass-forming compounds in the LTCC or HTCC green ceramic tape can melt and flow during firing, thereby bonding and integrating (i.e., cofiring) window 26 to ceramic body 83. This creates a hermetic seal between window 26 and body 83. Microelectronic device 100 is flip-chip interconnected to conductor 24. Window 26 is bonded directly to body 83 without having a separate layer of adhesive material disposed in-between window 26 and body 83. Monolithic body 83 can comprise a multilayered material, such as a low-temperature (LTCC) or high-temperature (HTCC) cofired ceramic multilayer; or a co-bonded printed wiring board (PWB) material. A third conductor 29 is disposed on a third level 95 of body 83.

Referring still to FIG. 20, after body 81 with integral window 26 has been fabricated, then a light-sensitive first microelectronic device 100 with MEMS structures 200 is flip-chip interconnected to first conductor 24 on first level 91, with the light-sensitive side of device 100 facing window 26. A second microelectronic device 300 is attached back-to-back to the backside of first microelectronic device 100 (e.g., by eutectic die attach, polymer or conductive polymer adhesive), and interconnected to second electrical conductor 25 on second level 92 via first wirebond 126 (e.g., gold, aluminum, or copper wirebond). A second wirebond 127 is made between second microelectronic device 300 and third conductor 29 on third level 95, which increases the density of interconnections to device 300. Optionally, wirebonds 126, 127 can be encapsulated in a glob-top polymer (not shown), and/or a cover lid (not shown) can be attached to the top surface of body 83.

Figure 21:
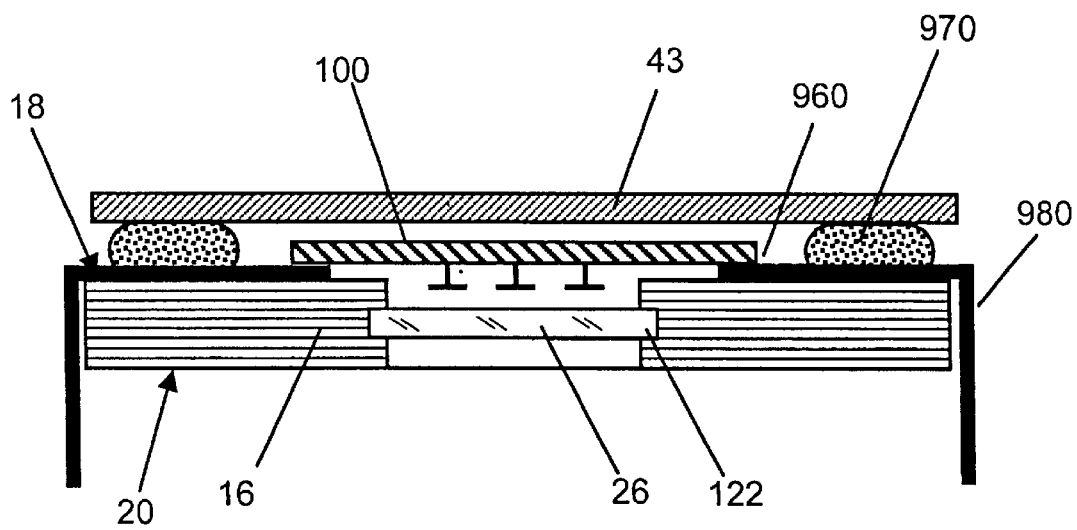
FIG. 21 shows a schematic cross section side view of another example of a package that houses a pair of microelectronic devices, according to the present invention.

FIG. 21 shows a schematic cross-section side view of another example of a package 8 for housing a microelectronic device 100, according to the present invention. Package 8 comprises an electrically insulating plate 16; an aperture 22 disposed through the plate; an electrical lead 980 disposed on second surface 18; and an integral window 26 disposed across aperture 22. Window 26 is bonded directly to plate 16 without having a separate layer of adhesive material disposed in-between window 26 and plate 16. Plate 16 can comprise a multilayered material, such as a low-temperature (LTCC) or high-temperature (HTCC) multi-layer or printed wiring board (PWB) composition. The joint between window 26 and plate 16 comprises an encased joint geometry 122 (as previously discussed with reference to FIG. 3B) without having a separate layer of adhesive material disposed in-between window 26 and plate 16. Microelectronic device 100 is TAB interconnected (e.g., by thermocompression bond 960) to electrical lead 980. Electrical lead 980 can be part of a TAB leadframe. Electrical lead 980 and cover lid 43 can be attached to plate 16 with a non-conductive hermetic seal or adhesive seal 970. Optionally, the outer edge of window 26 can be thick or thin-film metallized (or otherwise coated) with a metal or metal alloy to enhance the quality of bonding of window 26 with plate 16. With the self-locking (encased) geometry of window 26 shown in this example, then window 26 is cofired or cobonded simultaneously with multilayered plate 16.

An example of a sequence for fabricating package 8 where window 26 is simultaneously cofired with the insulating substrate (e.g., in FIG. 10A, 10B, or 10C), using LTCC or HTCC material, can comprise the following steps:

1. Personalizing individual layers (i.e., sheets) of ceramic green tape, including cutting out internal shapes that define the aperture; punching holes for vias; filling vias with the conductive ink or paste, and depositing conductive ink or paste for making thick-film electrical conductors (e.g., lines, traces, or bond pads).
2. Stacking (i.e., collating) and registering the individually personalized sheets, including placing a window at the proper position inside of the stack, disposed across the aperture. Layers are usually stacked on a pinned plate, which aligns each sheet using 4 pinholes—one in each corner.
3. Laminating the collated stack to form a "semi-rigid" green block by applying high pressure (up to 3000 psi) and low temperature (up to 70 C.) in a uniaxial press or an isostatic pressure vessel using a vacuum bag.
4. Baking the laminated block to burn out organic compounds in the green ceramic material and conductive paste/ink, and then firing to sinter and devitrify the glass-ceramic composite into a dense, consolidated ceramic substrate (i.e., cofiring) with substantially pure electrical conductors (metallized traces).

5. Plating fired thick film layers as necessary to establish needed properties such as bondability, solderability and adhesion—i.e., plating with nickel in the case of tungsten thick film in HTCC, followed by plating with gold for solderability, bondability, etc. When leads are brazed with CuSil in HTCC, there are two Ni plating steps—one in order to wet to the braze used in lead attachment, and a subsequent Ni plating to cover the braze and serve as a reliable underlayer for the gold.
6. Testing the hermeticity of the window's attachment (optional), e.g., with a He leak-check device.
7. Applying any post-fired compositions and firing them (solderable compositions, resistors). Since the substrate has already been fired, the cycle is the short one. Solder for pure gold would be selected for low dissolution of the gold (i.e., a Pb—In solder).
8. Orienting the microelectronic device and flip-chip bonding to metallized traces on the ceramic substrate.
9. Releasing any MEMS structures.
10. Underfilling the flip-chip interconnects with polymer underfill.
11. Applying a glob-top overmold, or attaching a cover lid or protective cover.

In this fabrication sequence, the integration of the window with the ceramic substrate occurs prior to attaching and electronically interconnecting the microelectronic device to the insulating substrate.

In general, the MEMS release step (if unreleased MEMS structures are present) can be performed either before or after flip-chip bonding in step 5. The release step removes sacrificial layer(s) of $SiO_2$ (or parylene) using a wet acid etch or a dry plasma etch. Etchants useful for removing $SiO_2$ (glass) include HF, HCL, Buffered Oxide Etch (BOE, which is a mixture of $HF+NH_3F+$ water); or reactive gases(e.g., $XeF_2$); or combinations thereof. BOE is a highly selective etchant, etching $SiO_X$ and stopping on Si (i.e., not attacking they underlying silicon, like HF alone can do sometimes). A sacrificial protective parylene coating can be removed by exposure to a oxygen ion-reactive plasma. Additional techniques disclosed in U.S. Pat. No. 6,335,224, "Protection of Microelectronic Devices During Packaging" to Peterson and Conley, which is incorporated herein by reference, can also be used in this fabrication sequence.

MEMS structures 200 can be released (after flip chip bonding in step 5) by flowing the release etchant fluid, gas, or reactive plasma through the gaps between flip-chip balls, bumps, or pads into cavity 202, whereupon the etchant removes the sacrificial layers from MEMS structures 200. Decoration of soldered joints (i.e., pitting), and galvanic effects, caused by exposure of solder interconnects to some types of release etchants needs to be carefully controlled, however. Release etchants can also react with unprotected cofired LTCC material. Accordingly, the LTCC surfaces (and, optionally, wirebonds, ball joints, etc. ) can be protected (i.e., passivated) with a polymer protective layers (e.g., parylene) prior to exposure to release etchants.

Alternatively, with respect to FIG. 10C, MEMS structures 200 can be released (after flip chip bonding in step 5) by flowing the release etchant fluid, gas, or plasma in and out through at least two holes (i.e., apertures 22', 22", 22''') into cavity 202, whereupon it removes the sacrificial layers from MEMS structures 200. In this case, apertures 22', 22", 22''' would subsequently be substantially filled with either a castable/moldable plug and/or a castable/moldable window after the release etch has occurred.

The examples shown in FIGS. 11, 12, 13, 15C, 19 and 20 depict a pair of microelectronic devices 100 and 300 mounted to each other back-to-back. The fabrication sequence can comprise flip-chip bonding the first microelectronic device 100 to plate 16, followed by attaching the second microelectronic device 100 to the backside of the first microelectronic device 100. Alternatively, the fabrication sequence can comprise attaching the second microelectronic device 100 to the backside of the first microelectronic device 100, followed by flip-chip bonding the first microelectronic device 100 to plate 16.

The particular examples discussed above are cited to illustrate particular embodiments of the invention. Other applications and embodiments of the apparatus and method of the present invention will become evident to those skilled in the art. For example, pairs of packages 8 can be attached together to make a sealed, symmetric package that houses four microelectronic devices. Additionally, the electrically insulating plates with apertures can be replaced with open frames. Also, in general, the microelectronic device 100 can be mounted and electrically interconnected by Tape Automated Bonding (TAB bonding) to electrical conductor 24, instead of flip-chip bonding. The actual scope of the invention is defined by the claims appended hereto.

What is claimed is:

1. A package with an integral window for housing a microelectronic device, comprising a monolithic multilayered body with an integral window; wherein the body comprises:
   a first sub-stack comprising at least one layer of an electrically insulating multilayered material, a first aperture disposed through the first sub-stack, and a first electrical conductor disposed on the top surface of the first sub-stack;
   a second sub-stack comprising at least one layer of the electrically insulating multilayered material, a second aperture disposed through the first sub-stack, and a second electrical conductor disposed on the top surface of the second sub-stack;
   a third sub-stack comprising at least one layer of the electrically insulating multilayered material and a third aperture disposed through the third sub-stack; and
   an integral window disposed across the first aperture;
   wherein the second sub-stack is stacked on top of the first sub-stack, and the third sub-stack is stacked on top of the second sub-stack;
   wherein the third aperture is wider than the second aperture;
   wherein the second aperture is wider than the first aperture; and
   wherein the integral window is bonded directly to the body without having a separate layer of adhesive material disposed in-between the window and the body.

2. The package of claim 1, wherein the window is bonded directly to a lip recessed inside of the body.

3. The package of claim 1, wherein the geometrical relationship between the window and the body comprises an encased joint geometry.

4. The package of claim 1, wherein the geometry of the outer edge of the window comprises a self-locking geometry selected from the group consisting of a tapered outer edge, a convex rounded outer edge, and a chevron-shaped double-tapered outer edge.

5. The package of claim 1, wherein the window is disposed on the bottom surface of the first sub-stack and extends laterally along the bottom surface of the first sub-stack a sufficient distance beyond the periphery of the first aperture to provide a sufficiently large overlapping area to provide a sufficiently high bond strength.

6. The package of claim 1, wherein the window substantially fills the aperture.

7. The package of claim 6, wherein the window is formed by casting a castable window material directly into the aperture.

8. The package of claim 7, wherein the castable window material comprises a molten glass that has solidified after casting or a transparent liquid polymer that has hardened after casting.

9. The package of claim 1, wherein the window comprises an optically transparent material selected from the group consisting of glass, sapphire, fused silica, clear plastic, and clear polymer.

10. The package of claim 1, wherein the window comprises a material selected from the group consisting of silicon, germanium, metal, metal alloy, lithium niobate and lithium tantalate.

11. The package of claim 1, wherein the window comprises a material selected from the group consisting of barium fluoride, calcium fluoride, lithium fluoride, magnesium fluoride, potassium fluoride, sodium chloride, zinc oxide, and zinc selenide.

12. The package of claim 1, wherein the window comprises an anti-reflection coating.

13. The package of claim 1, wherein the window comprises means for filtering selected wavelengths of light.

14. The package of claim 1, wherein the window further comprises a lens for optically transforming the light that passes through the window.

15. The package of claim 1, wherein the window further comprises an array of binary optic lenslets for optically transforming the light that passes through the window.

16. The package of claim 1, wherein the multilayered material comprises a low-temperature cofired ceramic material fired at a temperature from about 600 C. to about 1000 C.

17. The package of claim 1, wherein the multilayered material comprises a high-temperature cofired ceramic material fired at a temperature from about 1300 C. to about 1800 C.

18. The package of claim 1, wherein the multilayered material comprises a polymer-based printed wiring board material.

19. The package of claim 1, wherein at least one electrical conductor comprises a thick-film metallized trace.

20. The package of claim 1, wherein at least one electrical conductor comprises an electrical lead.

21. A package with an integral window for housing a microelectronic device, comprising:
   a monolithic body, comprising a electrically insulating multilayered material; the body having a bottom surface, an opposing top surface, a stepped aperture disposed through the body, and at least two interior ledges;
   a first electrical conductor disposed on the first interior ledge;
   a second electrical conductor disposed on the second interior ledge;
   an integral window disposed across the aperture and bonded directly to the body without having a separate layer of adhesive material disposed in-between the window and the body; and
   a first microelectronic device flip-chip interconnected to the first electrical conductor on the first interior ledge.

22. The package of claim 21, wherein the first microelectronic device comprises a chip selected from the group consisting of a semiconductor chip, a CCD chip, a CMOS chip, a VCSEL chip, a laser diode chip, a LED chip, a MEMS chip, and a IMEMS chip.

23. The package of claim 21, wherein the first microelectronic device comprises a light-sensitive side facing the window.

24. The package of claim 21, further comprising a polymer underfill encapsulating at least one of the flip-chip electrical interconnections.

25. The package of claim 21, further comprising a continuous ring seal disposed in-between the first microelectronic device and the body.

26. The package of claim 25, wherein the atmosphere in-between the window and the ring seal comprises a dry inert gas other than air, selected from the group consisting of argon, nitrogen, and helium, and combinations thereof.

27. The package of claim 21, further comprising a second microelectronic device, mounted back-to-back to the first microelectronic device.

28. The package of claim 27, wherein the second microelectronic device is wirebonded to the second electrical conductor.

29. The package of claim 28, wherein the wirebond and the pair of microelectronic devices are substantially encapsulated in a polymer-based encapsulant, except for any light-sensitive surfaces.

30. The package of claim 29, further comprising an opening in the polymer-based encapsulant for providing open access to the front side of the second microelectronic device.

31. The package of claim 30, wherein the opening in the polymer-based encapsulant is defined by a dam that encircles at least some of the front side of the second microelectronic device, which prevents any encapsulant from occluding the front side of the second microelectronic device during encapsulation of the wirebond.

32. The package of claim 28, wherein the body further comprises a third electrical conductor disposed on a third interior ledge, and further wherein the second microelectronic device has a wirebond interconnection to the third electrical conductor.

33. The package of claim 21, further comprising a wirebond interconnect made from the backside of the first microelectronic device to the second electrical conductor on the second interior ledge.

34. The package of claim 33, wherein the wirebond interconnect and the backside of the first microelectronic device are substantially encapsulated in a polymer-based encapsulant.

35. The package of claim 21, further comprising a cover lid attached to the top surface of the body for sealing the package.

36. The package of claim 35, wherein the cover lid is attached to the body with a material selected from the group consisting of a hermetic sealant and a polymer-based adhesive.

37. The package of claim 35, wherein the atmosphere inside the sealed package comprises a dry inert gas other than air, selected from the group consisting of argon, nitrogen, and helium, and combinations thereof.

38. The package of claim 21, further comprising a second microelectronic device flip-chip bonded to the second conductor on the second interior ledge.

39. A package with an integral window for housing a microelectronic device, comprising:
   a monolithic body, comprising a electrically insulating multilayered material; the body having a bottom surface, an opposing top surface, a stepped aperture disposed through the body, and at least two interior ledges;

a first electrical conductor disposed on the first interior ledge;

a second electrical conductor disposed on the second interior ledge;

an integral window disposed across the aperture and bonded directly to the body without having a separate layer of adhesive material disposed in-between the window and the body; and a first microelectronic device flip-chip interconnected to the first electrical conductor on the first interior ledge; and further comprising a cover lid attached to the top surface of the body for sealing the package;

wherein the cover lid is transparent.

40. A package with an integral window for housing a microelectronic device, comprising:

a monolithic body, comprising a electrically insulating multilayered material; the body having a bottom surface, an opposing top surface, a steered aperture disposed through the body, and at least two interior ledges;

a first electrical conductor disposed on the first interior ledge;

a second electrical conductor disposed on the second interior ledge;

an integral window disposed across the aperture and bonded directly to the body without having a separate layer of adhesive material disposed in-between the window and the body; and a first microelectronic device flip-chip interconnected to the first electrical conductor on the first interior ledge; and further comprising a cover lid attached to the top surface of the body for sealing the package;

wherein the cover lid comprises a window.

41. A package with an integral window for housing a microelectronic device, comprising:

a monolithic body, comprising a electrically insulating multilayered material; the body having a bottom surface, an opposing top surface, a stepped aperture disposed through the body, and at least two interior ledges;

a first electrical conductor disposed on the first interior ledge;

a second electrical conductor disposed on the second interior ledge;

an integral window disposed across the aperture and bonded directly to the body without having a separate layer of adhesive material disposed in-between the window and the body; and a first microelectronic device flip-chip interconnected to the first electrical conductor on the first interior ledge;

wherein the first microelectronic device comprises a light-sensitive side facing the window;

wherein the package is mounted on, and is electrically interconnected to, a printed wiring board;

wherein the printed wiring board comprises an opening through the board; and wherein the aperture in the package is aligned with the opening in the printed wiring board, thereby allowing light to pass through both the opening and the aperture to interact with the light-sensitive side of the first microelectronic device.

* * * * *